United States Patent
Ha et al.

(10) Patent No.: US 11,830,549 B2
(45) Date of Patent: Nov. 28, 2023

(54) METHOD OF OPERATING SELECTOR DEVICE, METHOD OF OPERATING NONVOLATILE MEMORY APPARATUS APPLYING THE SAME, ELECTRONIC CIRCUIT DEVICE INCLUDING SELECTOR DEVICE, AND NONVOLATILE MEMORY APPARATUS

(71) Applicants: SK hynix Inc., Icheon (KR); Industry-University Cooperation Foundation Hanyang University ERICA Campus, Ansan (KR)

(72) Inventors: Tae Jung Ha, Guri (KR); Soo Gil Kim, Yongin (KR); Jeong Hwan Song, Seongnam (KR); Tae Joo Park, Ansan (KR); Tae Jun Seok, Yongin (KR); Hye Rim Kim, Dongducheon (KR); Hyun Seung Choi, Geoje (KR)

(73) Assignees: SK hynix Inc., Icheon (KR); Industry-University Cooperation Foundation Hanyang University ERICA Campus, Ansan (KR)

( * ) Notice: Subject to any disclaimer, the term of this patent is extended or adjusted under 35 U.S.C. 154(b) by 0 days.

(21) Appl. No.: 17/855,424

(22) Filed: Jun. 30, 2022

(65) Prior Publication Data
US 2023/0005537 A1  Jan. 5, 2023

(30) Foreign Application Priority Data
Jul. 2, 2021 (KR) .................. 10-2021-0087022

(51) Int. Cl.
*G11C 13/00* (2006.01)
*G11C 11/16* (2006.01)
(Continued)

(52) U.S. Cl.
CPC ...... *G11C 13/0038* (2013.01); *G11C 11/1697* (2013.01); *H10B 63/20* (2023.02); *H10N 70/841* (2023.02); *H10N 70/8833* (2023.02)

(58) Field of Classification Search
CPC ............ G11C 13/0002; G11C 13/0007; G11C 2213/71; G11C 2213/77; G11C 2213/15;
(Continued)

(56) References Cited

U.S. PATENT DOCUMENTS 9,177,916 B1\* 11/2015 Barabash ............. H10N 70/826
10,079,060 B2  9/2018 Jo et al.

FOREIGN PATENT DOCUMENTS

KR  100316706 B1  12/2001

\* cited by examiner

*Primary Examiner* — Thong Q Le

(57) ABSTRACT

Disclosed are a method of operating a selector device, a method of operating a nonvolatile memory apparatus to which the selector device is applied, an electronic circuit device including the selector device, and a nonvolatile memory apparatus. The method of operating the selector device controls access to a memory element, and includes providing the selector device including a switching layer and first and second electrodes disposed on both surfaces of the switching layer, which includes an insulator and a metal element, and applying a multi-step voltage pulse to the switching layer via the first and second electrodes to adjust a threshold voltage of the selector device, the multi-step voltage pulse including a threshold voltage control pulse and an operating voltage pulse. The operating voltage pulse has a magnitude for turning on the selector device, and the threshold voltage control pulse has a lower magnitude lower than the operating voltage pulse.

24 Claims, 27 Drawing Sheets

(51) Int. Cl.
*H10B 63/00* (2023.01)
*H10N 70/00* (2023.01)

(58) Field of Classification Search
CPC . G11C 2213/51; G11C 2213/56; G11C 11/56; G11C 11/5685; G11C 13/0064; G11C 13/0069; G11C 13/0097; G11C 2213/32; H10N 70/24; H10N 70/826; H10N 70/8833; H10N 70/883; H10N 70/026; H10N 70/841; H10N 70/801; H10N 70/8416; H10N 70/023; H10N 70/011; H10N 70/041; H10N 70/25; H10N 70/028; H10N 70/828; H10N 70/021; H10N 70/231; H10N 70/884; H10N 70/00

See application file for complete search history.

Precursor state $V_o$   Neutral dimer $V_o$ defect

METHOD OF OPERATING SELECTOR DEVICE, METHOD OF OPERATING NONVOLATILE MEMORY APPARATUS APPLYING THE SAME, ELECTRONIC CIRCUIT DEVICE INCLUDING SELECTOR DEVICE, AND NONVOLATILE MEMORY APPARATUS

CROSS-REFERENCES TO RELATED APPLICATION

The present application claims, under 35 U.S.C. § 119(a), the benefit of Korean application No. 10-2021-0087022, filed on Jul. 2, 2021, which is herein incorporated by reference in its entirety.

BACKGROUND

1. Field

The present disclosure relates to an electronic device, an apparatus, and an operating method thereof, and more particularly, to a method of operating a selector device, a method of operating a nonvolatile memory apparatus to which the same is applied, an electronic circuit device including the selector device, and a nonvolatile memory apparatus.

2. Description of the Related Art

As the next-generation memories based on resistance changes, such as ReRAM (resistive random-access memory), PCRAM (phase-change RAM), and MRAM (magnetic RAM) have non-volatile characteristics, they have the advantages that power consumption may be greatly reduced, and high speed and high reliability may be obtained. In addition, due to its simple structure, higher integration is possible as compared to the existing NAND flash memory, and when it is manufactured as a crossbar array structure, a large-capacity memory device may be implemented according to the design rule of 4F2.

In a memory having a crossbar array structure, memory cells are positioned at intersections (cross-points) of word lines and bit lines. In this case, information read errors may occur due to leakage current generated in unselected cells during the read/write process of a memory having a parallel structure, or a sensing margin may be reduced, or the maximum size (capacity) of integrated memory may be limited. In order to suppress such a leakage current component, a selector device suitable for a memory may be used.

When a selector device connected in series with a memory element is inserted in the integrated memory structure, a memory operation error generated due to a leak current generated in a cell unselected may be suppressed by the selector device. At this time, the operating voltage is different depending on, for example, the material of the variable resistor in which the resistance change occurs within the same type of memory, that is, the material of the resistive memory layer as well as the type of memory used in connection with the selector device. Thus, the required operating characteristics of the selector device also change. Therefore, the operating voltage of the selector device may be determined in consideration of the operating voltage of the memory element connected thereto. To this end, it may be desirable to precisely control the driving characteristics of the selector device. In developing the next-generation memory, it may be desirable to develop a selector device having a structure/material and characteristics suitable for the type of memory and the material of the memory layer even in the same type of memory.

SUMMARY

An object of embodiments of the present disclosure is to provide a method of operating a selector device capable of easily adjusting the threshold voltage of the selector device without changing the material or configuration of the selector device.

Furthermore, another object of embodiments of the present disclosure is to provide a method of operating nonvolatile memory apparatus to which the above-described method of operating the selector device is applied.

Another object of embodiments of the present disclosure is to provide an electronic circuit device including the above-described selector device and a driving circuit unit for operating the same.

Further, another object of embodiments of the present disclosure is to provide a nonvolatile memory apparatus to which the above-described selector device and a driving circuit unit are applied.

The objects to be accomplished by embodiments of the present disclosure are not limited to the objects mentioned above, and other objects not mentioned may be understood by those skilled in the art from the following description.

According to one embodiment of the present disclosure, there is provided a method of operating a selector device for controlling access of a signal to a memory element, and the method comprises providing a selector device including a switching layer including an insulator and a separate metal element, and first and second electrodes disposed on both surfaces of the switching layer; and applying a multi-step voltage pulse comprising a threshold voltage control pulse and a subsequent operating voltage pulse to the switching layer via the first and second electrodes, and wherein the operating voltage pulse has an intensity for turning on the selector device, and the threshold voltage control pulse has a lower intensity than the operating voltage pulse, and the applying the multi-step voltage pulse is configured to adjust a threshold voltage (Vth) of the selector device by application of the threshold voltage control pulse.

The insulator may include defects therein, and the selector device may be a two-terminal device which operates based on charge charging into the defects of the insulator and forming a conduction path between the insulator and the metal element.

The insulator may include at least one of silicon oxide, aluminum oxide, zirconium oxide, hafnium oxide, tungsten oxide, titanium oxide, nickel oxide, copper oxide, manganese oxide, tantalum oxide, niobium oxide, iron oxide, antimony oxide, silicon nitride, and aluminum nitride.

The metal element may include at least one of arsenic (As), germanium (Ge), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

The switching layer may include the insulator doped with the metal element.

The switching layer may include a silicon oxide ($SiO_2$) doped with arsenic (As), the arsenic may correspond to the metal element, and the silicon oxide may correspond to the insulator.

A duration time of the threshold voltage control pulse may be about 0.1 µs to 500 µs, or about 0.1 µs to 5 µs, or about 0.2 µs to 5 µs.

An intensity of the threshold voltage control pulse may be about 0.3 V to 2.0 V.

The threshold voltage (Vth) may be decreased by the application of the threshold voltage control pulse, and a decrease width of the threshold voltage (Vth) may be within about 1.5 V.

A duration time of the operating voltage pulse may be about 0.01 μs to about 10 μs.

An intensity of the operating voltage pulse may be about 0.5 V to 5 V.

According to another embodiment of the present disclosure, there is provided a method of operating a non-volatile memory apparatus comprising a plurality of first electrode lines extending in a first direction, a plurality of second electrode lines spaced apart from the plurality of first electrode lines and extending in a second direction intersecting the first direction, and a plurality of memory cells disposed at intersections between the plurality of first electrode lines and the plurality of second electrode lines, each of the plurality of memory cells comprising a memory element having a non-volatile property and a selector device connected in series with the memory element, the method of operating a non-volatile memory apparatus includes the above-described method of operating a selector device.

According to another embodiment of the present disclosure, there is provided an electronic circuit device comprising a selector device for controlling access of a signal to a memory element, the selector device including a switching layer including an insulator and a separate metal element, and first and second electrodes disposed on both surfaces of the switching layer; and a driving circuit portion configured to apply a multi-step voltage pulse comprising a threshold voltage control pulse and a subsequent operating voltage pulse to the switching layer via the first and second electrodes; wherein the operating voltage pulse has an intensity for turning on the selector device, the threshold voltage control pulse has a lower intensity than the operating voltage pulse, and wherein the driving circuit unit is configured to adjust the threshold voltage (Vth) of the selector device by application of the threshold voltage control pulse.

The insulator may include defects therein, and the selector device may be a two-terminal device which operates based on charge charging into the defects of the insulator and forming a conduction path between the insulator and the metal element.

The insulator may include at least one of silicon oxide, aluminum oxide, zirconium oxide, hafnium oxide, tungsten oxide, titanium oxide, nickel oxide, copper oxide, manganese oxide, tantalum oxide, niobium oxide, iron oxide, antimony oxide, silicon nitride, and aluminum nitride.

The metal element may include at least one of arsenic (As), germanium (Ge), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

The switching layer may include the insulator doped with the metal element.

The switching layer may include a silicon oxide ($SiO_2$) doped with arsenic (As), the arsenic may correspond to the metal element, and the silicon oxide may correspond to the insulator.

A duration time of the threshold voltage control pulse may be about 0.1 μs to 500 μs, or about 0.1 μs to 5 μs, or about 0.2 μs to 5 μs.

An intensity of the threshold voltage control pulse may be about 0.3 V to 2.0 V.

The threshold voltage (Vth) may be decreased by the application of the threshold voltage control pulse, and a decrease width of the threshold voltage (Vth) may be within about 1.5 V.

A duration time of the operating voltage pulse may be about 0.01 μs to about 10 μs.

An intensity of the operating voltage pulse may be about 0.5 V to 5 V.

According to another embodiment of the present disclosure, there is provided a non-volatile memory apparatus comprising a memory device unit comprising a plurality of first electrode lines extending in a first direction, a plurality of second electrode lines spaced apart from the plurality of first electrode lines and extending in a second direction intersecting the first direction, and a plurality of memory cells disposed at intersections between the plurality of first electrode lines and the plurality of second electrode lines, each of the plurality of memory cells comprising a memory element having non-volatile property and a selector device connected in series with the memory element; and a memory control circuit unit for controlling the operation of the memory device unit and including a driving circuit unit for driving the selector device, and wherein the selector device and the driving circuit unit constitute the above-described electronic circuit device.

According to embodiments of the present disclosure, it is possible to implement an operating method of a selector device capable of easily adjusting the characteristics (e.g., threshold voltage) of the selector device without changing (or adjusting) the material or configuration of the selector device. Accordingly, the characteristics (e.g., threshold voltage) of the selector device may be adjusted according to the type and material of the memory element coupled to the selector device. Since the characteristics (e.g., threshold voltage) of the selector device may be adjusted according to the memory characteristics without change of a manufacturing process and structural change of the selector device, the techniques according to these embodiments may be usefully applied to research and development of next-generation memory apparatuses. In particular, the techniques according to the embodiment may be usefully applied to a crossbar memory array apparatus having a 1S (selector)-1R (resistor) structure.

DETAILED DESCRIPTION

Figure 1A:
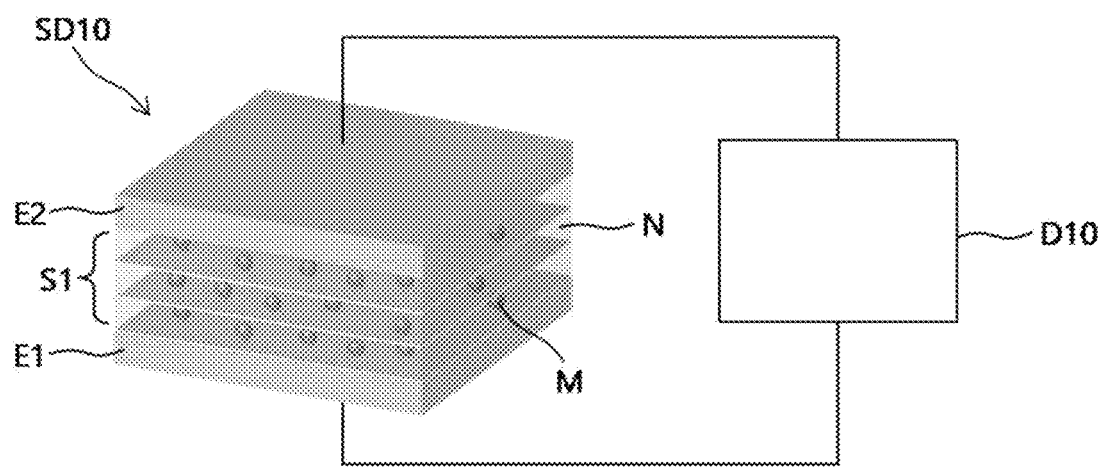
FIG. 1A is a diagram for explaining an electronic circuit device including a selector device and an operating method of a selector device according to an embodiment of the present disclosure.

Hereinafter, the embodiments of the present disclosure will be described in detail with reference to the accompanying drawings.

The embodiments of the present disclosure to be described below are provided to more clearly explain the present disclosure to those of ordinary skill in the related art, and the scope of the present disclosure is not limited by the following embodiments, and the following embodiments may be modified in many different forms.

The terminology used herein is used to describe specific embodiments, and is not used to limit the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed present disclosure unfairly.

Hereinafter, embodiments of the present disclosure will be described in detail with reference to the accompanying drawings. The size or thickness of the regions or parts shown in the accompanying drawings may be slightly exaggerated for clarity and convenience of description. The same reference numerals refer to the same elements throughout the detailed description.

Figure 1B:
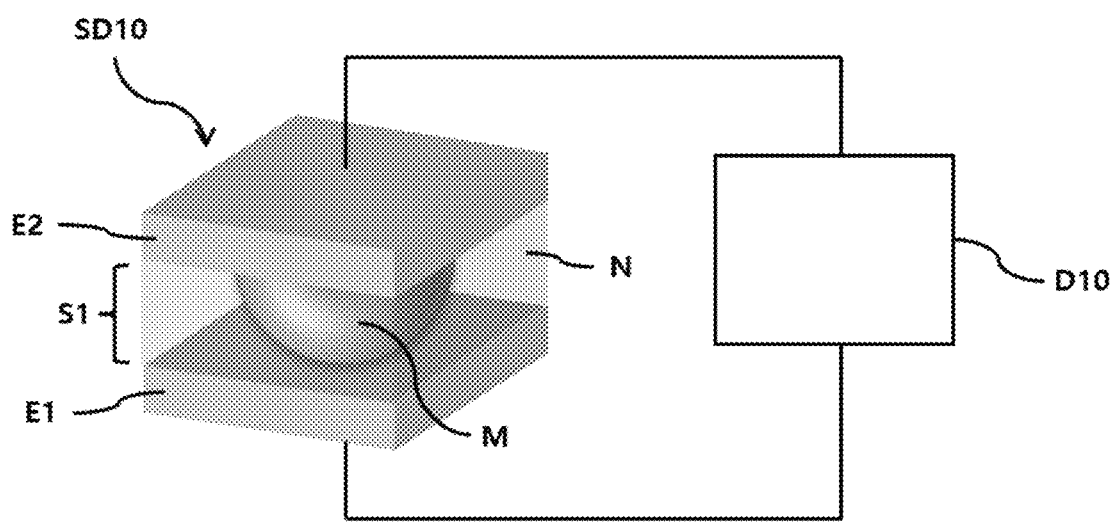
FIG. 1B is a diagram for explaining an electronic circuit device including a selector device and an operating method of a selector device according to an another embodiment.

FIG. 1A is a diagram for explaining an electronic circuit device including a selector device and an operating method of a selector device according to an embodiment of the present disclosure, and FIG. 1B is a diagram for explaining an electronic circuit device including a selector device and an operating method of a selector device.

Referring to FIG. 1A, an electronic circuit device according to an embodiment of the present disclosure may include a selector device SD10 and a driving circuit unit (e.g., a driving circuit) D10 electrically connected to the selector device SD10.

The selector device SD10 is a device for controlling access of a signal to a storage element (not shown), and may serve to substantially block or minimize leakage current generated in the unselected cells of the memory array. The selector device SD10 may include a switching layer S1, and the first and the second electrodes E1 and E2 disposed on both surfaces of the switching layer S1. A switching layer S1 may be disposed between the first and second electrodes E1 and E2. The first electrode E1 may be disposed on a lower surface of the switching layer S1, and the second electrode E2 may be disposed on an upper surface of the switching layer S1. The first electrode E1 and the second electrode E2 may be provided or shared by the wires of an electronic circuit device or the electrodes of other memory devices. This will be separately described later.

The switching layer S1 may include an insulator N and a metal element M dispersed in the insulator N. The insulator N of the switching layer S1 may contain defects therein, and the selector device SD10 may be a two-terminal device operating based on charge charging into the defects of the insulator N and forming of a conduction path between the insulator N and the metal element M. The insulator N may include one or more of silicon oxide, aluminum oxide, zirconium oxide, hafnium oxide, tungsten oxide, titanium oxide, nickel oxide, copper oxide, manganese oxide, tantalum oxide, niobium oxide, iron oxide, antimony oxide, silicon nitride, and aluminum nitride. A metal element may include one or more of arsenic (As), germanium (Ge), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

The metal element M may be doped and present in the insulator N. As a result, the switching layer S1 may include the insulator N doped with the metal element M. In an embodiment, the doping may be a doping process realized by performing an ion implantation process. In a process in which the metal element M is doped into the insulator N by the ion implantation, defects in the insulator N may be induced. For example, the doping concentration (e.g., an ion implantation concentration) of the metal element M may be approximately $2 \times 10^{21} \sim 2 \times 10^{23}$ atoms/cm$^3$.

In an embodiment, the switching layer S1 may include silicon oxide SiO$_x$ doped with arsenic (As), where As may correspond to a metal element M, and SiO$_x$ may correspond to an insulator N, and may be expressed as As:SiO$_2$. In this case, the doping concentration of As may be about $2 \times 10^{21} \sim 2 \times 10^{23}$ atoms/cm$^3$. The metal elements M may be distributed substantially uniformly in the insulator N. The distribution of the metal element M may be layered so that the metal element layer and the insulator N layer may be alternated at least twice or more, for providing the switching layer S1. Such a layer of the metal element M (or a metal element layer) may be a layer in which atoms or clusters of atoms are dispersed at a predetermined density in the same layer, rather than a continuous metal layer. Alternatively, for example, the metal element layer may include one large cluster composed of a metal element M. In some cases, the atoms and the clusters may be mixed. The distribution of the metal element M shown in FIG. 1A is illustrated as only an example, and may be variously changed. Silicon oxide SiO$_x$ may be stoichiometric SiO$_2$ or oxygen deficiency, but embodiments of the present disclosure are not limited thereto.

In the case of an As:SiO$_2$ based-device according to an embodiment, in particular, oxygen vacancy defects inside SiO$_2$ may have a stable energy level as a neutral defect having a dimer structure in the vicinity of the valence band depending on the state of charge of electrons, and as a form of a bipolar charging defect having an energy level similar to the work function of As in the neutral section of the band gap. The two types of defects may act as oxygen vacancy defects having variable energy levels due to the charging and discharging of holes by an electric field. In this case, a formation of a tunneling path composed of charging defects in SiO$_2$ which are generated due to a hole charging may lead to the resistance change.

The first and second electrodes E1 and E2 may include a metal or a conductive metal compound. Here, the metal compound may be a metal nitride, a metal oxide, a metal carbide, or a mixture or compound thereof. One or both of the first and second electrodes E1 and E2 may include one or more of titanium nitride, tantalum nitride, tungsten nitride, tungsten, aluminum, copper, tantalum, titanium, gold, platinum, silver, ruthenium, iridium and molybdenum. In an embodiment, the first and second electrodes E1 and E2 may include TiN (titanium nitride) or may be formed of TiN.

The driving circuit unit D10 may be configured to apply a multi-step voltage pulse including a threshold voltage control pulse and a subsequent operating voltage pulse to the switching layer S1 through the first and second electrodes E1 and E2. A memory cell including a selector device may be formed by connecting a memory element in series to the switching layer S1. Each of the memory cells may be connected through the driving circuit unit D10 and a wiring for a cell access such as a bit line and/or a word line. Thus, it may store information or perform a logical operation.

Referring to FIG. 1B, in another embodiment of the present disclosure, the metal elements M form a single cluster in the switching layer S1 is illustrated. In this case, the reference character M in FIG. 1B may refer to a large cluster. Other matters may be the same as described with reference to FIG. 1A. In some embodiments, a plurality of the large clusters may be inserted into the insulator N. In an embodiment, the average size, or diameter of the large clusters may be in the range of 30% to 90% of the thickness of the insulator N.

Figure 2:
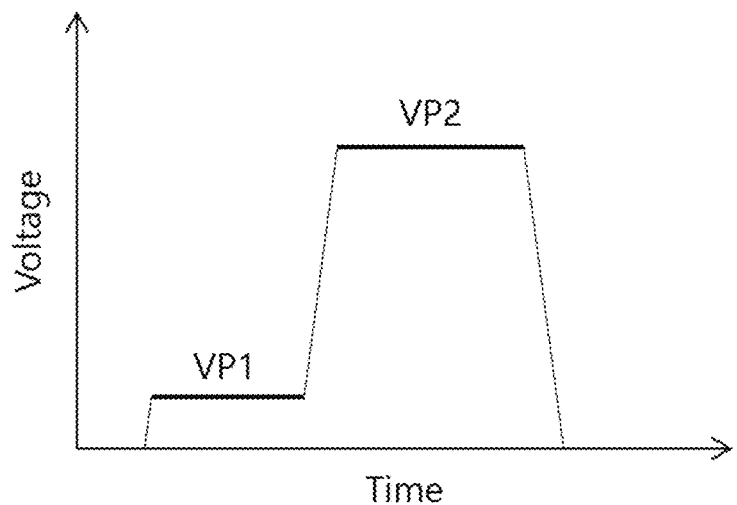
FIG. 2 is a graph schematically showing a multi-step voltage pulse that may be applied to an operating method of a selector device according to an embodiment of the present disclosure.

FIG. 2 is a graph schematically showing a multi-step voltage pulse that may be applied to an operating method of a selector device according to an embodiment of the present disclosure.

Referring to FIG. 2, the driving circuit unit D10 illustrated in FIG. 1A or FIG. 1B may apply a multi-step voltage pulse to a selector device (e.g., the selector device SD10 in FIG. 1A or FIG. 1B). The multi-step voltage pulse may be a two-step voltage pulse including a threshold voltage control pulse VP1 and a subsequent operating voltage pulse VP2, as shown in FIG. 2. For example, the multi-step voltage pulse may have a single aggregate waveform including the threshold voltage control pulse VP1 and the operating voltage pulse VP2 that immediately follows the threshold voltage control pulse VP1. The operating voltage pulse VP2 may have an intensity (or a magnitude) for turning on the selector device, and the threshold voltage control pulse VP1 may have a intensity (or a magnitude) lower than that of the operating voltage pulse VP2. The threshold voltage control pulse VP1 activates the energy band structure of the switching layer S1 to a given level (e.g., a predetermined level) without turning on the selector device SD10. Therefore, it serves to make the switching layer S1 have a set threshold value. The step for applying the threshold voltage control pulse VP1 may be a step for forming a tunneling path composed of charged oxygen bonds having an elevated energy level through hole charging into the neutral oxygen defects in the insulating layer (e.g., see N in FIG. 1A), for example, SiO$_2$ by applying a voltage of a relatively low magnitude. As a result, the driving circuit unit D10 may adjust the threshold voltage Vth of the selector device SD10 by the threshold voltage control pulse VP1. Here, the threshold voltage Vth may indicate a critical voltage for turning on the selector device SD10. For example, the threshold voltage Vth may be decreased by application of the threshold voltage control pulse VP1. Here, the decrease width of the threshold voltage Vth may be less than about 1.5 V. For example, when the threshold voltage Vth is decreased from a first threshold voltage to a second threshold voltage, the decrease width of the threshold voltage Vth may correspond to a difference between the first threshold voltage to the second threshold voltage.

A duration of the threshold voltage control pulse VP1 may be about 0.1 μs to 500 μs, or about 0.1 μs to 5 μs, or about 0.2 μs to 5 μs. An intensity (or a magnitude) of the threshold voltage control pulse VP1 may be, for example, about 0.3 V to 2.0 V. When the above-described duration and the intensity conditions are satisfied, activation of the energy band structure for adjusting the threshold voltage Vth may be efficiently achieved by using the threshold voltage control pulse VP1. If the duration of the threshold voltage control pulse VP1 is less than about 0.1 μs or less than about 0.2 μs, the effect of adjusting the threshold voltage Vth may be relatively insignificant. Meanwhile, when the duration of the threshold voltage control pulse VP1 exceeds about 500 μs or about 5 μs, power consumption may be excessively large and an operation speed may be relatively slow. In an embodiment, the magnitude of the threshold voltage control pulse VP1 may be in a range from about 6% to about 60% of that of the operating voltage pulse VP2. If the magnitude of the threshold voltage control pulse VP1 is less than 0.3V or 6% of that of the operating voltage pulse VP2, the effect of adjusting the threshold voltage Vth may be insignificant, or the duration of the threshold voltage control pulse VP1 may be excessively long, or both. If the magnitude of the threshold voltage control pulse VP1 is greater than 2.0V or 60% of that of the operating voltage pulse VP2, power consumption may be excessively large, or a significant amount of current may flow when the threshold voltage control pulse VP1 is applied, or both. The slope of a ramp section (e.g., the rising ramp or the falling ramp section) of the threshold voltage control pulse VP1 may be in the range of 70° to 90°.

A duration of the operating voltage pulse VP2 may be, for example, about 0.01 μs to 10 μs. An intensity (or a magnitude) of the operating voltage pulse VP2 may be, for example, about 0.5 V to about 5 V. When the above-described duration and the intensity conditions are satisfied, a driving current may be obtained while effectively turning on the selector device (SD10 of FIG. 1A) by using the operating voltage pulse VP2. A preferred duration and preferred intensity of the operating voltage pulse VP2 may be changed according to the configuration of the selector device SD10.

Figure 3A:
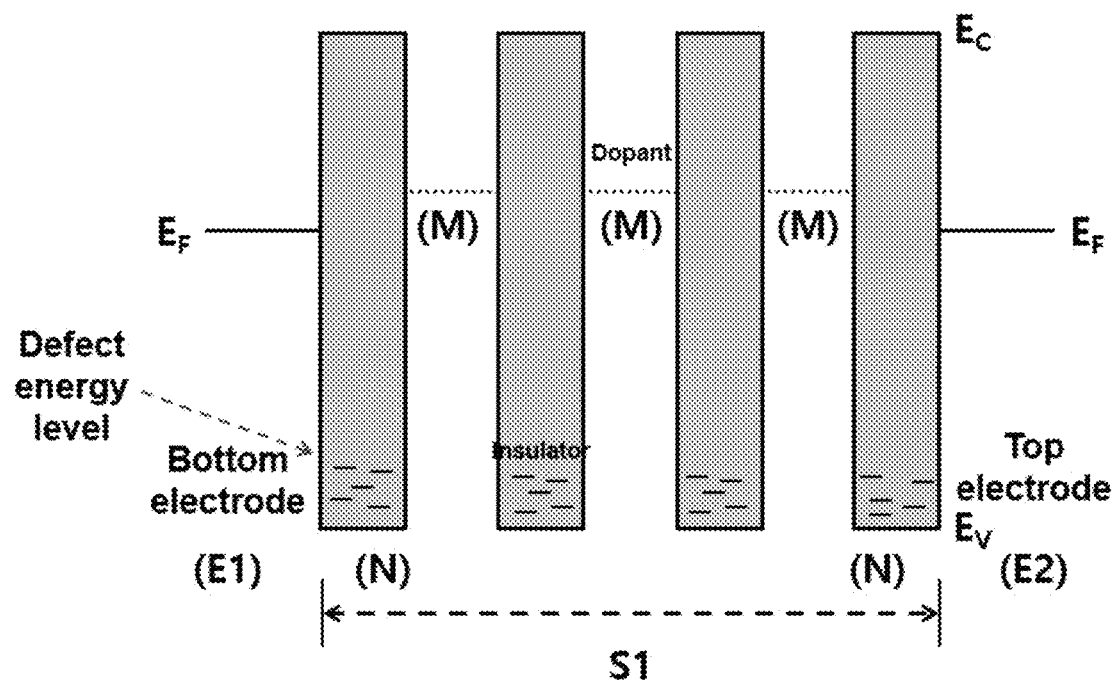
FIG. 3A is an energy band diagram showing an energy band structure in an equilibrium state of a selector device according to an embodiment of the present disclosure.
Figure 3B:
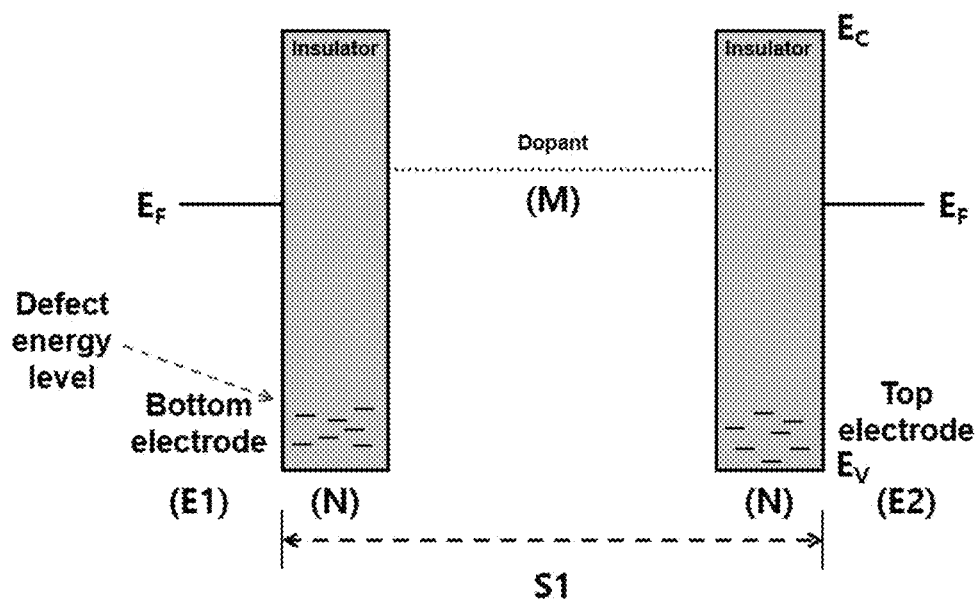
FIG. 3B is an energy band structure in an equilibrium state of a selector device according to another embodiment of the present disclosure.

FIG. 3A is an energy band diagram showing an energy band structure in an equilibrium state of a selector device according to an embodiment of the present disclosure, and FIG. 3B is an energy band structure in an equilibrium state of a selector device according to another embodiment of the present disclosure. In these drawings, the reference numeral $E_C$ denotes the lowest energy level of a conduction band, $E_V$ denotes the highest energy level of a valence band, and $E_F$ denotes a Fermi energy level. The reference numerals E1, E2, S1, N, and M correspond to the configurations described with reference to FIGS. 1A and 1B. That is, FIG. 3A may be an energy band diagram of the device having the structure of FIG. 1A, and FIG. 3B may be an energy band diagram of the device having the structure of FIG. 1B. FIG. 3A shows an ideal energy band structure before a multi-step voltage pulse, particularly a threshold voltage control pulse is applied to the selector device. Alternatively, the energy band structure of FIG. 3A may be in a state after a forming process.

Referring to FIG. 3A, the metal dopant, that is, the metal element M, forms an independent phase without forming a compound with the insulator N. Therefore, between the electrodes E1 and E2, the band structure of the insulator N and the band structure of the metal element M form an alternating energy band structure which is independent and is adjacent to each other. An energy level due to a neutral defect formed in the insulator N, that is, a defect energy level in a neutral state may be located at a position closer to $E_V$ than $E_C$, that is, a significantly lower level. In this case, a conductive path is not formed between the first electrode E1 and the second electrode E2 in the entire switching layer S1, and the switching layer S1 may have an insulating property.

Referring to FIG. 3B, it is an energy band diagram showing an energy band structure in an equilibrium state of a selector device according to another embodiment of the present disclosure. The energy band structure of FIG. 3B shows an ideal energy band structure before a multi-step voltage pulse, in particular, a threshold voltage control pulse, is applied to the selector device. Alternatively, the energy band structure of FIG. 3B may be in a state after a forming process.

Figure 4A:
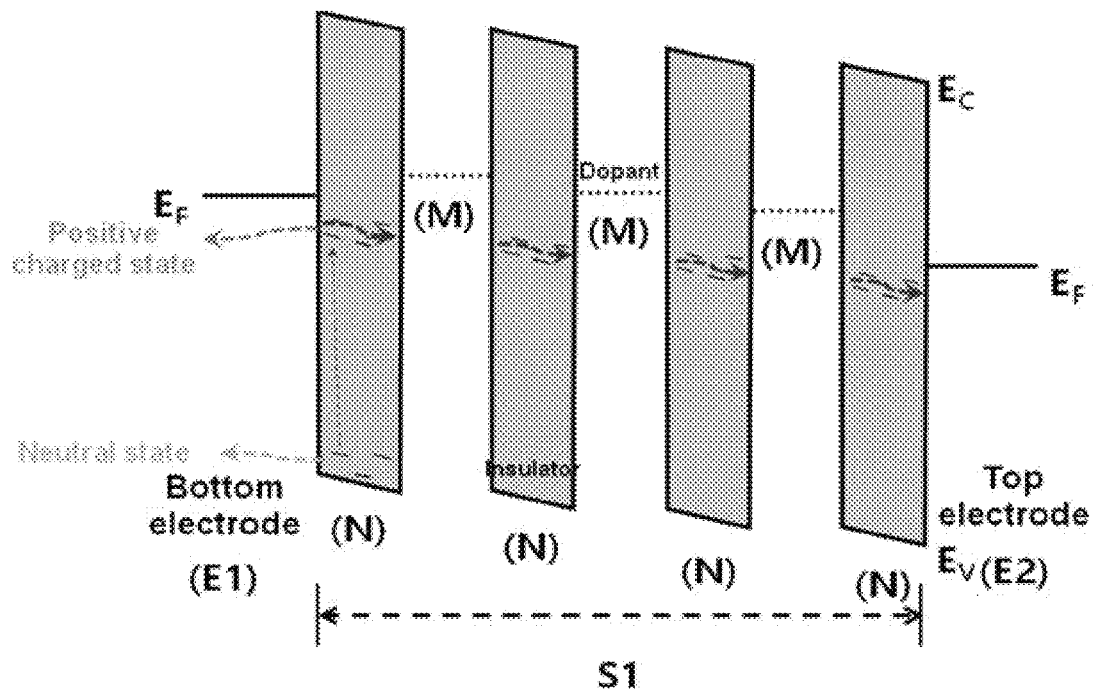
FIG. 4A is an energy band diagram illustrating a change in the energy band structure that the energy band structure in the equilibrium state of FIG. 3A experiences as a voltage is applied to a selector device according to an embodiment of the present disclosure.
Figure 4B:
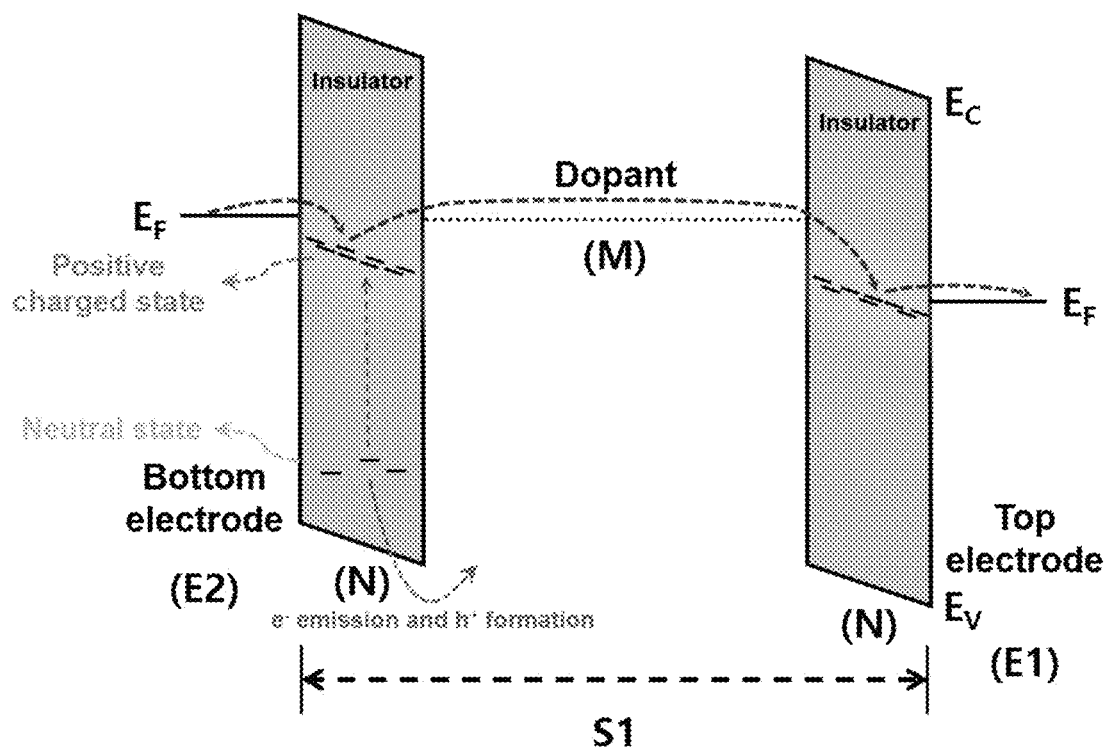
FIG. 4B is an energy band diagram illustrating a change in the energy band structure that the energy band structure in the equilibrium state of FIG. 3B experiences as a voltage is applied to a selector device according to another embodiment of the present disclosure.

FIG. 4A is an energy band diagram illustrating a change in the energy band structure that the energy band structure in the equilibrium state of FIG. 3A undergoes as a voltage is applied to a selector device according to an embodiment of the present disclosure, and FIG. 4B is an energy band diagram illustrating a change in the energy band structure that the energy band structure in the equilibrium state of FIG. 3B undergoes as a voltage is applied to a selector device according to another embodiment of the present disclosure.

First of all, referring to FIG. 4A, in connection with the selector device structure shown in FIG. 1A having the energy band structure of the equilibrium state shown in FIG. 3A, as a voltage is applied between the first electrode E1 and the second electrode E2, an electric charge is injected into the neutral defect of the insulator N. Accordingly, the defect energy level may rise to a height similar to the $E_F$ of the metal element M, and some alignment may be achieved with the energy level (i.e., $E_F$) of the metal element M. In addition, a voltage between the first electrode E1 and the second electrode E2 forms a predetermined slope in the energy band structure of the switching layer S1 by the electric field. As such, when the neutral defect is filled with an electric charge, the defect energy level rises to a height similar to the $E_F$ of the metal element M and is aligned with the energy level (i.e., $E_F$) of the metal element M. When a slope of a certain level or more is formed in the energy band structure of the switching layer S1, a conduction path connecting the first electrode E1 and the second electrode E2 through the switching layer S1 may be formed, and the resistance may be rapidly reduced. Thus, a threshold switching may take place. The neutral oxygen vacancy defect (a neutral dimer state) has a stable state in the case of a dimer structure, and a positive charged state may be formed through hole charging thereto. The defects charged with electric charges inside the insulator N may serve to form a conduction path together with the metal element M. When the conduction path is formed, an ohmic current may flow through the insulator N. In FIG. 4A, the indication, "neutral state" may indicate a state of a neutral defect having an energy level in the vicinity of the conduction band, which may mean a neutral dimer state. In addition, in one embodiment, as shown in FIG. 4A, the "positive charged state" refers to an example positive charged defect state induced in the band gap, which may indicate a positive charged defect state. A stable positive charged defect state is activated by the threshold voltage control pulse, and the positive charged defect state may form a tunneling path in the insulator as shown in a red color.

As in an embodiment of the present disclosure, when a threshold voltage control pulse (VP1 in FIG. 2) is initially applied and an operating voltage pulse (VP2 in FIG. 2) is subsequently applied by using a multi-step voltage pulse, the threshold voltage Vth of the selector device may be adjusted by application of the threshold voltage control pulse VP1. As the threshold voltage control pulse VP1 is applied, the electric charges are charged into the defects of the insulator N, and the defect energy level may increase to a height similar to $E_F$ of the metal element M. In this state, the selector device may be turned on by applying the operating voltage pulse VP2.

If the selector device is switched (turned on) by using only a predetermined operating voltage pulse without using the threshold voltage control pulse VP1, a gradient is created in the energy band structure of the switching layer S1, but as the conduction path does not exist, a switching speed may become slow, and the actual threshold voltage Vth may be increased. Also, in this case, the threshold voltage Vth may be set to substantially a single level.

However, as in an embodiment of the present disclosure, when the operating voltage pulse VP2 is applied after the predetermined threshold voltage control pulse VP1 is applied, the threshold voltage Vth of the selector device may be adjusted by the application of the threshold voltage control pulse VP1. The degree by which the electric charges fill the neutral defects of the insulator N is controlled by adjusting the threshold voltage control pulse VP1, and the defect energy level compared to $E_F$ of the metal element M is controlled, thereby adjusting the threshold voltage Vth of the selector device. In this state, when the operating voltage pulse VP2 equal to or greater than the adjusted threshold voltage Vth is applied, the selector device may be turned on (switched) and driven.

In an embodiment, a step for adjusting the threshold voltage may be achieved by adjusting the duration and the intensity of the threshold voltage control pulse VP1. Accordingly, the threshold voltage Vth of the selector device may be adjusted and used according to the type or material characteristics of the memory element to which the selector device is connected. Since the threshold voltage Vth of the selector device may be easily adjusted without changing (adjusting) the material, the configuration, or the manufacturing method of the selector device, it is possible to realize characteristics (e.g., threshold voltage) of the selector device optimized for memory characteristics. In addition, the techniques according to embodiments of the present disclosure may be usefully applied to research and development of next-generation memory devices. In particular, the techniques according to the embodiment may be usefully applied to a crossbar memory array having a 1S (selector)-1R (resistor) structure or a logic device such as a neuromorphic apparatus.

Referring to FIG. 4B, the selector device of FIG. 1B having the energy band structure in the equilibrium state shown in FIG. 3B undergoes a change in the energy band structure as a voltage is applied. The ideal energy band structure of FIG. 3B undergoes a change similar to that described with reference to FIG. 4A while the threshold voltage control pulse is applied. In one embodiment, a tunneling conduction path is activated in the insulating layer due to a polarity charging defect formed in the band gap, for example, a positive charging defect, by application of a threshold voltage control pulse, and electron emission and holes may be simultaneously generated in the neutral state defect.

In the foregoing description, as the threshold voltage control pulse VP1 is applied, the electric charges fill the defects of the insulator N, the defect energy level is adjusted, the threshold voltage Vth is adjusted through the difference in height when being compared with the $E_F$ of the metal element M, and then, a predetermined operating voltage pulse VP2 is applied to form a gradient in the energy band, thereby turning on the selector device. However, embodiments of the present disclosure are not limited thereto. For example, the phenomenon in which the defect energy level rises to a height similar to the $E_F$ of the metal element M may be caused by the application of the operating voltage pulse VP2, rather than the application of the threshold voltage control pulse VP1. In other words, by applying the threshold voltage control pulse VP1 to charge the defect in the insulator N in advance, when a predetermined operating voltage pulse VP2 is applied in this state, the defect energy level may be increased to a height similar to the $E_F$ of the metal element M. In addition, a gradient is formed in the energy band, and the selector device may be turned on.

In the case of the selector device according to an embodiment of the present disclosure, if the voltage is removed after being turned on once, it may return to an original state (e.g., an equilibrium state) or a state similar thereto. Thus, the above-described multi-step voltage pulse may be applied again in order to operate (e.g., turn-on) the selector device once again.

Figure 5:
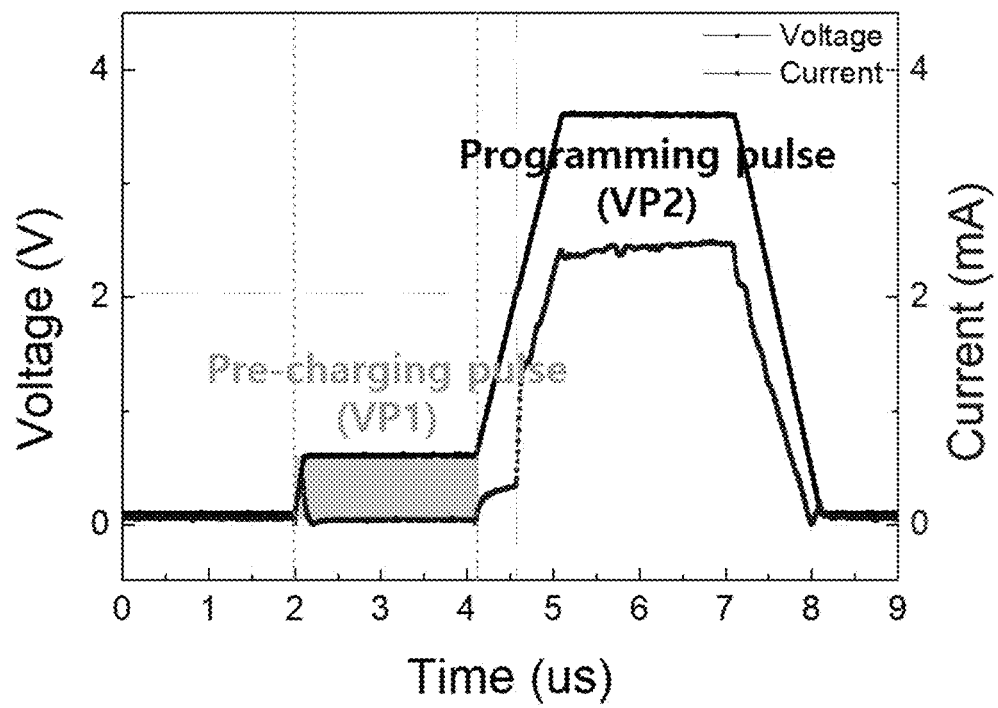
FIG. 5 is a graph showing a multi-step voltage pulse applied to an operating method of a selector device according to an embodiment of the present disclosure.

FIG. 5 is a graph showing a form of a multi-step voltage pulse applied to an operating method of a selector device according to an embodiment of the present disclosure.

Referring to FIG. 5, the multi-step voltage pulse may include a threshold voltage control pulse VP1 and a subsequent operating voltage pulse VP2. The multi-step voltage pulse may be a two-step voltage pulse. The threshold voltage control pulse VP1 and the operating voltage pulse VP2 in FIG. 5 may correspond to the threshold voltage control pulse VP1 and the operating voltage pulse VP2 described with reference to FIG. 2, respectively. The threshold voltage Vth may be adjusted through charging of electric charge by the application of the threshold voltage control pulse VP1. The step for applying the threshold voltage control pulse VP1 is a step for applying a sufficiently low voltage pulse before turning on the selector device, and may be a step of allowing charging to be performed by injecting the electric charges to defects. The intensity of the threshold voltage control pulse VP1 may be about 0.1 V to 2.0 V, or about 0.3 V to 2.0 V, or about 0.1 V to 1.5 V, or about 0.3 V to 1.5 V.

The step for applying the operating voltage pulse VP2 may be a step for applying a voltage pulse having a sufficiently large size for turning on the selector device. The intensity of the operating voltage pulse VP2 may be about 0.5 V to about 5 V. Referring to the right vertical axis in the graph of FIG. 5, the changes in current (current between the first electrode and the second electrode in the selector device) according to voltage application may also be confirmed. Although substantially no current flows while the threshold voltage control pulse VP1 is applied, it may be confirmed that an ohmic current flows while the operating voltage pulse VP2 is applied.

Figure 6:
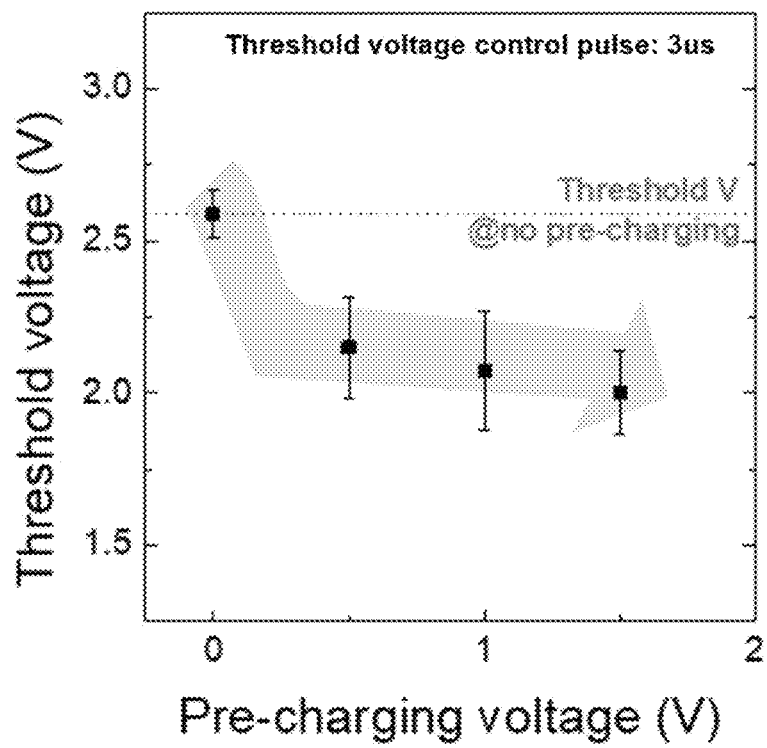
FIG. 6 is a graph illustrating a change in the threshold voltage (Vth) according to the intensity of a threshold voltage control pulse applied to a selector device according to an embodiment of the present disclosure.
Figure 7:
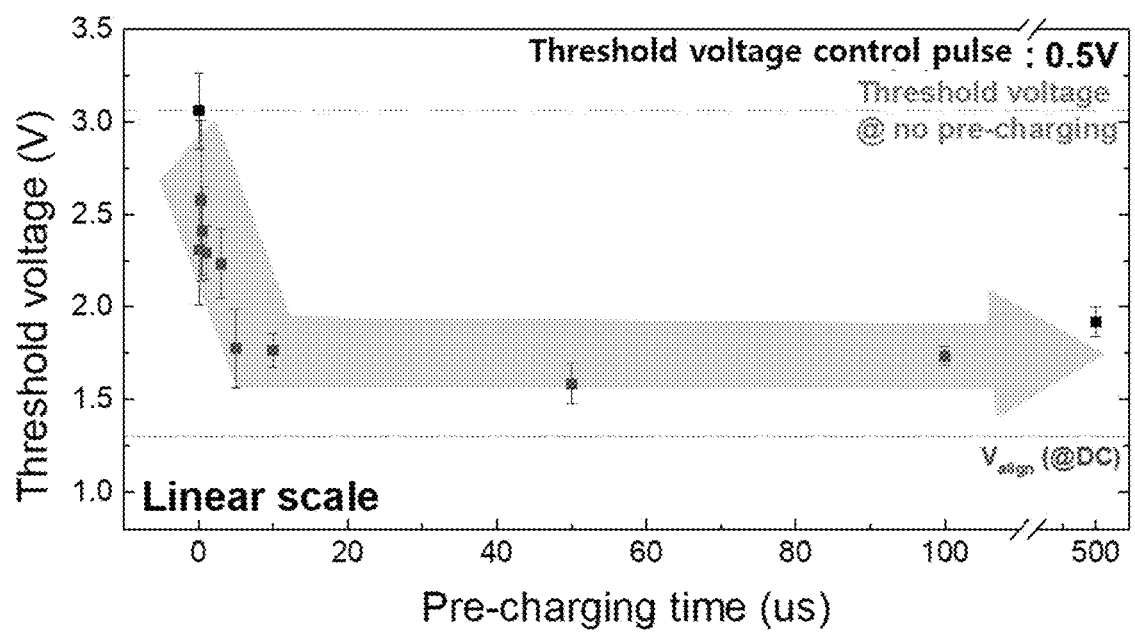
FIG. 7 is a graph illustrating a change in the threshold voltage (Vth) of a selector device according to a duration time of a threshold voltage control pulse applied to the selector device according to an embodiment of the present disclosure.

FIG. 6 is a graph illustrating a change in the threshold voltage (Vth) according to the intensity of a threshold voltage control pulse applied to a selector device according to an embodiment of the present disclosure. At this time, the duration (or a width) of the threshold voltage control pulse was fixed to 3 µs. FIG. 7 is a graph illustrating a change in the threshold voltage (Vth) of a selector device according to a duration of a threshold voltage control pulse applied to the selector device according to an embodiment of the present disclosure. At this time, the intensity (i.e., an amplitude) of the threshold voltage control pulse was fixed to 0.5 V.

Referring to FIG. 6, the threshold voltage decreases as the intensity of the threshold voltage control pulse increases. In FIG. 7, when the electric charges flow and fill the defects in the switching layer occurs due to the application of the threshold voltage control pulse, the threshold voltage (i.e., the threshold switching voltage) Vth at which the selector device is operated decreases, and the threshold voltage Vth tends to converge to a certain level. The time required for the convergence of the threshold voltage Vth is the basis for designing the width of the threshold voltage control pulse, and the duration of the threshold voltage control pulse may be determined within the range of about 0.1 µs~500 µs or about 0.1 µs~5 µs or about 0.2 µs~5 µs. In addition, it may be preferable that the intensity of the threshold voltage control pulse is about 0.3 V to 2.0 V.

Figure 8:
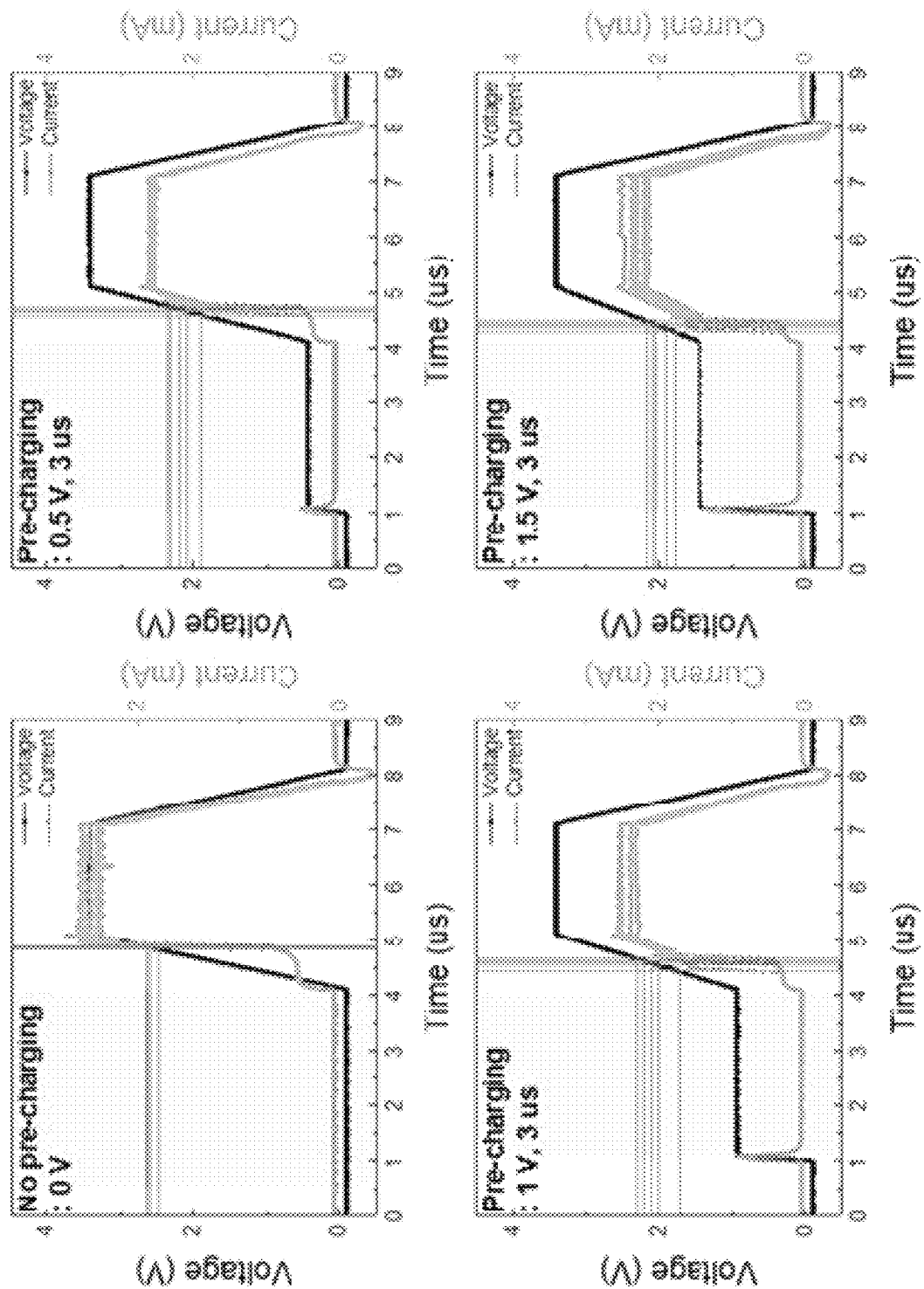
FIG. 8 is a graph showing the shape of a multi-step voltage pulse used to obtain the result of FIG. 6 and a change in current accordingly.
Figure 9:
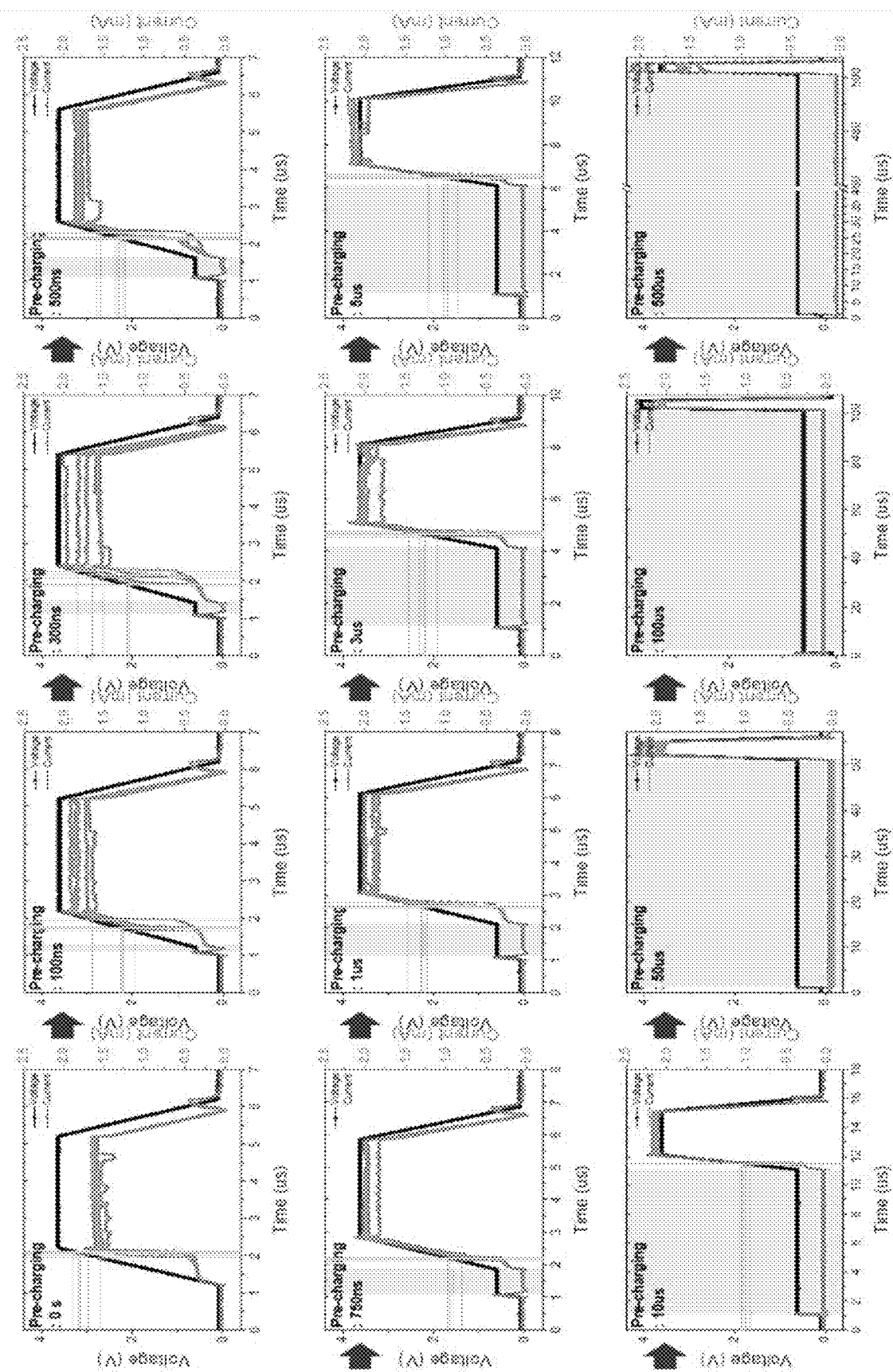
FIG. 9 is a graph showing the shape of the multi-step voltage pulse used to obtain the result of FIG. 7 and the change in current accordingly.

FIG. 8 is a graph showing the shape of a multi-step voltage pulse used to obtain the result of FIG. 6 and a change in current accordingly. FIG. 9 is a graph showing the shape of the multi-step voltage pulse used to obtain the result of FIG. 7 and the change in current accordingly. A maximum value of the threshold voltage control pulse voltage may be determined under a condition that little current flows while the threshold voltage control pulse is applied.

Figure 10:
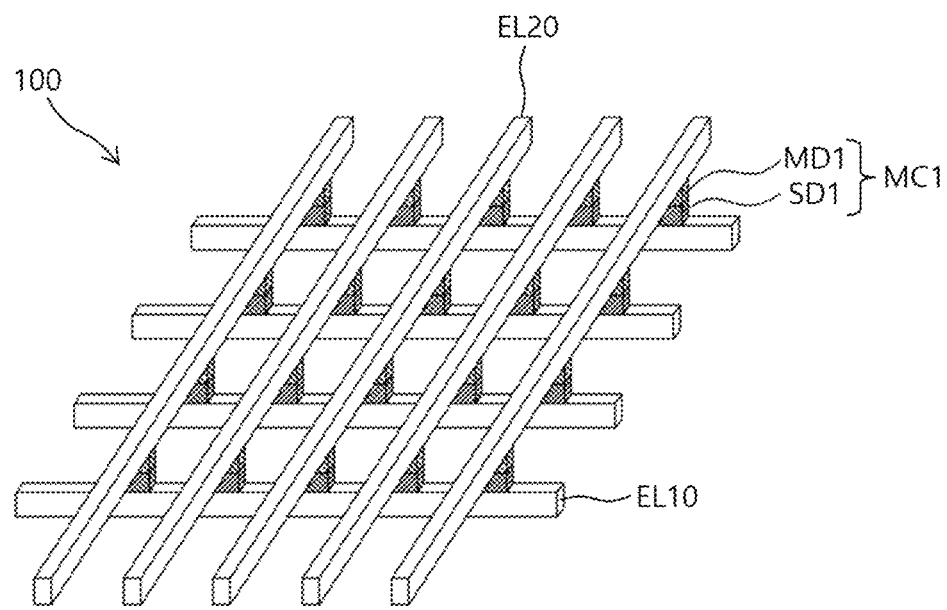
FIG. 10 is a perspective view illustrating a nonvolatile memory apparatus and an operating method thereof according to an embodiment of the present disclosure.

FIG. 10 is a perspective view illustrating a nonvolatile memory apparatus and an operating method thereof according to an embodiment of the present disclosure.

Referring to FIG. 10, a nonvolatile memory apparatus according to an embodiment of the present disclosure may include a memory device unit (or a memory device) 100. The memory device unit 100 may have a crossbar memory array structure. The memory device unit 100 may include a plurality of first electrode lines EL10 extending in a first direction, a plurality of second electrode lines EL20 which are spaced apart from a plurality of first electrode lines EL10, and extending in a second direction intersecting the first direction, and a plurality of memory cells MC1 disposed at intersections (cross-points) between the plurality of first electrode lines EL10 and the plurality of second electrode lines EL20. In an embodiment, the plurality of second electrode lines EL20 may extend to perpendicularly cross the plurality of first electrode lines EL10. One of the first electrode line EL10 and the second electrode line EL20 may be a word line, and the other may be referred to as a bit line. In addition, both the first electrode line EL10 and the second electrode line EL20 may be regarded as a kind of wiring.

Each of the plurality of memory cells MC1 may include a memory element MD1 having a non-volatile property and a selector device SD1 connected in series with the memory element MD1. The memory element MD1 may include a type of variable resistor. Accordingly, the memory cell MC1 may have a 1S (selector)-1R (resistor) structure. Here, the selector device SD1 may correspond to the selector device SD10 described with reference to FIG. 1A or the like. A first electrode (e.g., the lower electrode) of the selector device SD1 may be connected to the first electrode line EL10, and in some cases, at least a portion of the lower electrode may be replaced with a corresponding portion of the first electrode line EL10. The memory element MD1 may include a memory layer, and a second electrode (e.g., an upper electrode) of the selector device SD1 may be disposed between the memory layer and the switching layer of the selector device SD1. In this case, the upper electrode of the selector device SD1 may be an intermediate electrode or a floating electrode. The memory layer (or the variable resistance layer) of the memory element MD1 may include, for example, any one selected from the group consisting of a resistive change memory layer, a phase change memory layer, a magnetic memory layer, and the like. Any memory material applicable to the conventional crossbar type memory device may be applied to the memory element MD1. The nonvolatile memory apparatus according to the present embodiment may be ReRAM, PCRAM, MRAM, or other types of RAM.

The configuration of the memory device unit 100 shown in FIG. 10 is only an example, and may vary according to embodiments. For example, the memory cell MC1 may have a cylindrical shape, and the positions of the memory element MD1 and the selector device SD1 may be changed. In addition, after disposing a plurality of third electrodes (not shown) on the plurality of second electrodes EL20 to intersect the plurality of second electrodes EL20, a plurality of second memory cells (not shown) may be disposed at intersections between the plurality of second electrodes EL20 and the plurality of third electrodes. The second memory cell may have the same structure as the memory cell MC1 or may have an inverse structure (upside down structure) of the memory cell MC1. In addition, the configuration of the memory device unit 100 may be variously changed.

In another embodiment, the selector device SD1 is a steering element of a memristor, and may simultaneously implement a memory and a computation function and may simulate a role of a synapse of the brain. For example, when a synapse, which is a connection part between a pre-neuron and a post-neuron, is configured in a circuit, a memristor may be implemented by the selector device according to an embodiment of the present disclosure and a variable resistor connected in series therewith. The pre-neuron may input a pre-spike signal to the synapse, and the synapse may transmit a predetermined synaptic signal to the post-neuron, and the post-neuron may generate a post-spike signal.

Similar to the structure wherein the synapse connects pre-neuron and post-neuron, the memristor element may serve to connect a pre-synaptic neuron circuit and a post-synaptic neuron circuit. The plurality of memristor elements MC1 may be arranged to form a plurality of columns and a plurality of rows. A plurality of first wirings EL10 may be arranged, and a plurality of second wirings EL20 crossing the plurality of first wirings EL10 may be arranged, and a memristor element MC1 may be provided at the intersection of the first wiring EL10 and the second wiring EL20. The plurality of first wirings EL10 each may be connected to a first electrode (e.g., a lower electrode) of the memristor element MC1, and the plurality of second wirings EL20 each may be connected to a second electrode (e.g., an upper electrode) of the memristor element MC1. The first wiring EL10 may be connected to a pre-synaptic neuron circuit, and the second wiring EL20 may be connected to a post-synaptic neuron circuit.

The selector device SD1 included in FIG. 10 may be operated according to the operating method of the selector device according to the embodiments described with reference to FIGS. 1A to 9. Accordingly, the descriptions described with reference to FIGS. 1A to 9 may also be applied to the selector device SD1 of FIG. 10.

Figure 11:
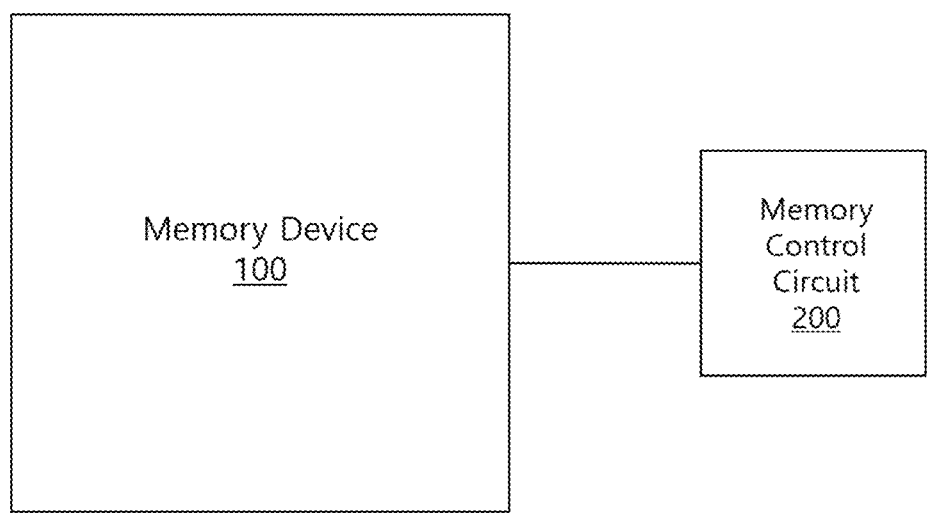
FIG. 11 is a block diagram illustrating a nonvolatile memory apparatus according to an embodiment of the present disclosure.

FIG. 11 is a block diagram illustrating a nonvolatile memory apparatus according to an embodiment of the present disclosure.

Referring to FIG. 11, the nonvolatile memory apparatus according to the embodiment may include a memory device unit (e.g., a memory device) 100 and a memory control circuit unit (e.g., a memory control circuit) 200 electrically connected thereto. The memory device unit 100 may correspond to the memory device unit 100 described with reference to FIG. 10. The memory control circuit unit 200 is a unit (e.g., a controller) for controlling the operation of the memory device unit 100, and may include a driving circuit unit (e.g., a driving circuit) for driving a selector device included in the memory device unit 100. The driving circuit unit may correspond to the driving circuit unit D10 described with reference to FIG. 1A. Accordingly, the selector device included in the memory device unit 100 and the driving circuit unit included in the memory control circuit unit 200 may constitute the electronic circuit device described in FIG. 1A and the like.

According to the embodiments of the present disclosure described above, it is possible to implement an operating method of a selector device capable of easily adjusting the characteristics (e.g., threshold voltage) of the selector device without changing (adjusting) the material or configuration of the selector device. Accordingly, the characteristic (threshold voltage) of the selector device may be adjusted according to the type and material of the memory element coupled to the selector device. Since the characteristic (threshold voltage) of the selector device may be adjusted according to the memory characteristics without change of a manufacturing process and structural change of the selector device, the techniques according to the embodiment may be usefully applied to research and development of next-generation memory devices. In particular, the techniques according to the embodiment may be usefully applied to a crossbar memory array device.

Figure 12A:
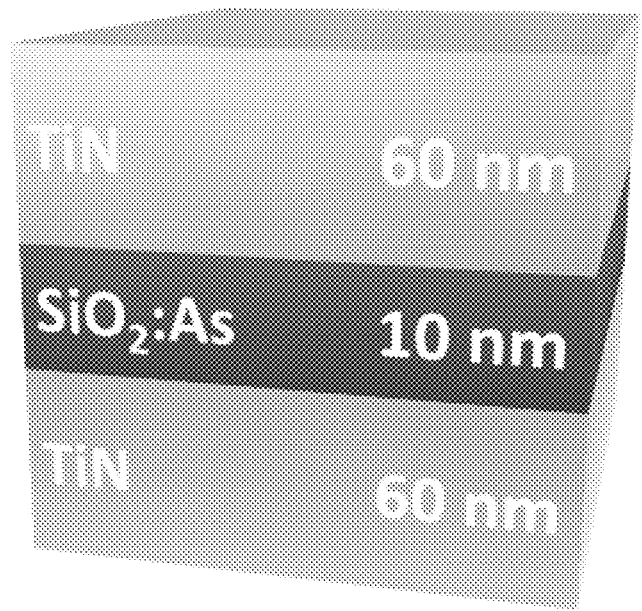
FIG. 12A shows a configuration of a selector device according to an embodiment of the present disclosure.
Figure 12B:
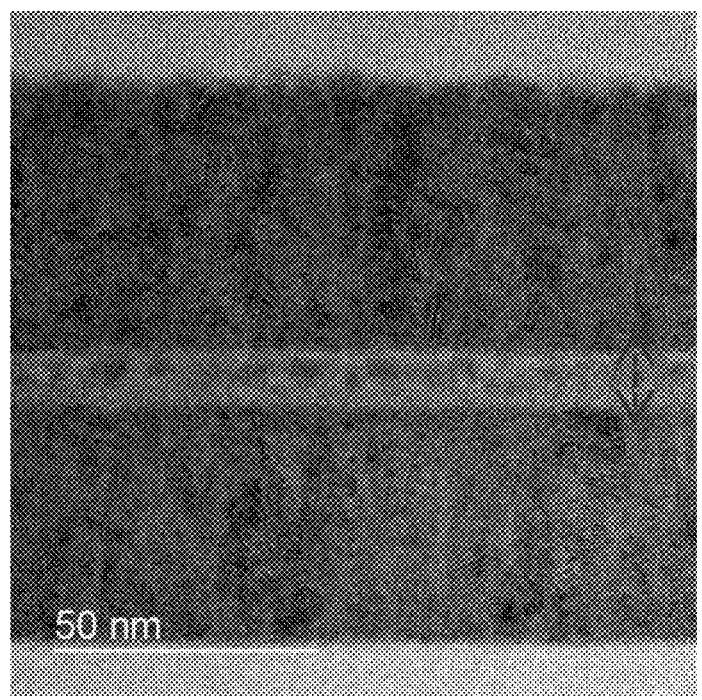
FIG. 12B shows a cross-sectional image of a transmission electron microscopy (TEM) of a corresponding selector device.

FIG. 12A shows a configuration of a selector device according to an embodiment of the present disclosure, and FIG. 12B shows a cross-sectional image of a transmission electron microscopy (TEM) of a corresponding selector device according to an embodiment.

Referring to FIGS. 12A and 12B, the selector device may have a structure in which, for example, a first TiN layer, an As:SiO$_x$ layer (e.g., an As-doped SiO$_2$ layer), and a second TiN layer are stacked. The first TiN layer may be a first electrode, the second TiN layer may be a second electrode, and the As-doped SiO$_2$ layer may be a switching layer. In the switching layer, As may exist in an elemental state, and in some cases, a portion of the As element may form a cluster. The configuration of the selector device disclosed in FIG. 12 is only an example and may be variously changed.

Figure 13A:
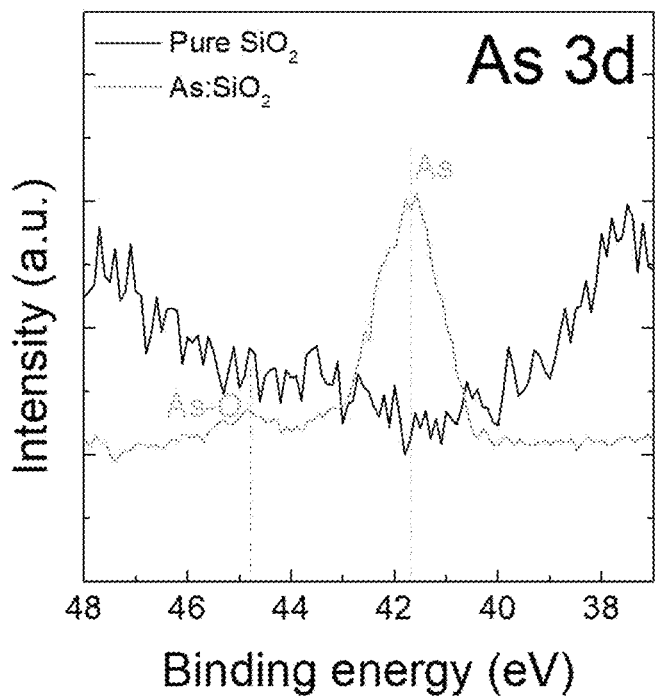
FIGS. 13A, 13B, and 13C show the results of X-ray photoelectron spectroscopy (XPS) analysis on the As-doped $SiO_2$ layer (i.e., $As:SiO_x$ layer) of FIG. 12.
Figure 13B:
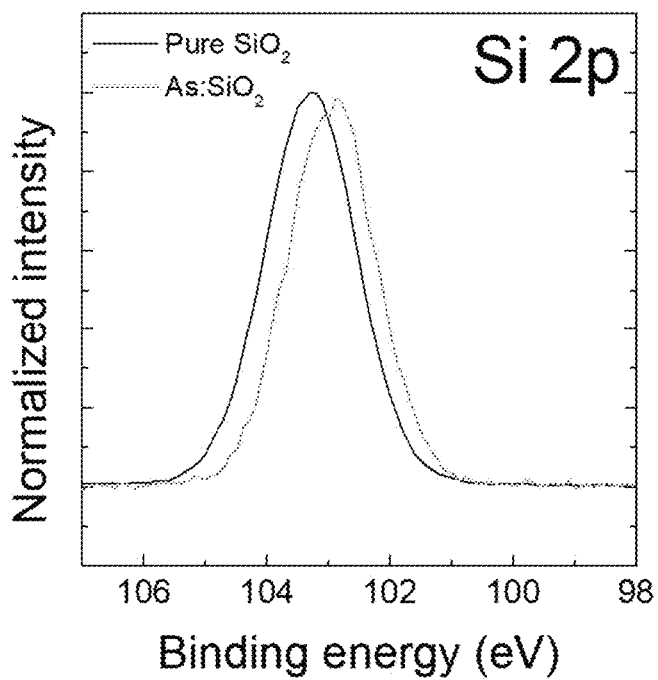
Figure 13C:
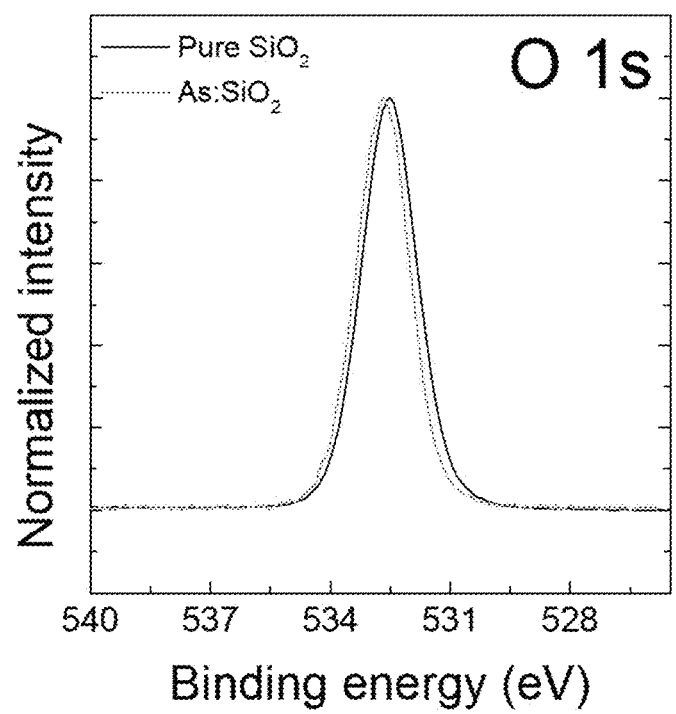

FIGS. 13A, 13B, and 13C show the results of X-ray photoelectron spectroscopy (XPS) analysis on the As-doped SiO$_2$ layer (i.e., As:SiO$_x$ layer) of FIG. 12A. FIGS. 13A to 13C illustrate analysis results performed on a sample without an upper electrode (i.e., the second TiN layer of FIG. 12A). FIGS. 13A to 13C also show the results of analysis performed for the pure SiO$_x$ layer and the As:SiO$_x$ layer.

Referring to FIG. 13A, it is assumed that As present in the As:SiO$_x$ layer may mostly exist in an elemental state, and in the case of As present on the surface of the As:SiO$_x$ layer, a part thereof may exist in an oxidized state (As$_2$O$_5$, As$_2$O$_3$).

Referring to FIG. 13B, it may be confirmed that the graph is shifted toward low binding energy in the As:SiO$_2$ layer implanted with As as compared to the pure SiO$_x$ layer. This may indicate that a large amount of defects (SiO$_x$, oxygen vacancy) were generated in SiO$_2$ during the As ion injection process.

FIGS. 14A, 14B, 14C, and 14D each show an operation characteristic according to a direct current (DC) voltage applied to a selector device according to an embodiment of the present disclosure.

Figure 14A:
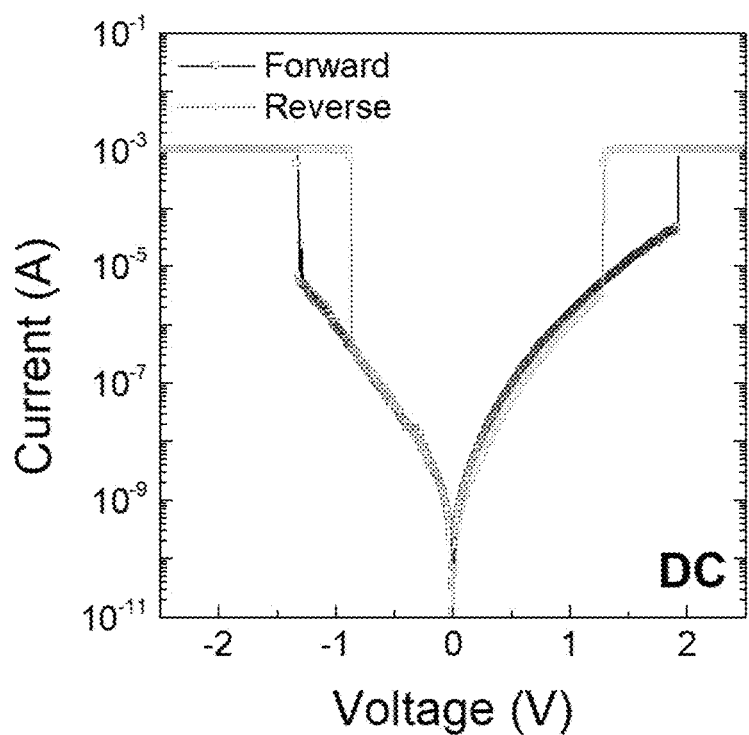
FIGS. 14A, 14B, 14C, and 14D each show an operation characteristic according to a direct current (DC) voltage applied to a selector device according to an embodiment of the present disclosure.

Referring to FIG. 14A, the threshold switching operation of the selector device according to the DC voltage application may be confirmed.

Figure 14B:
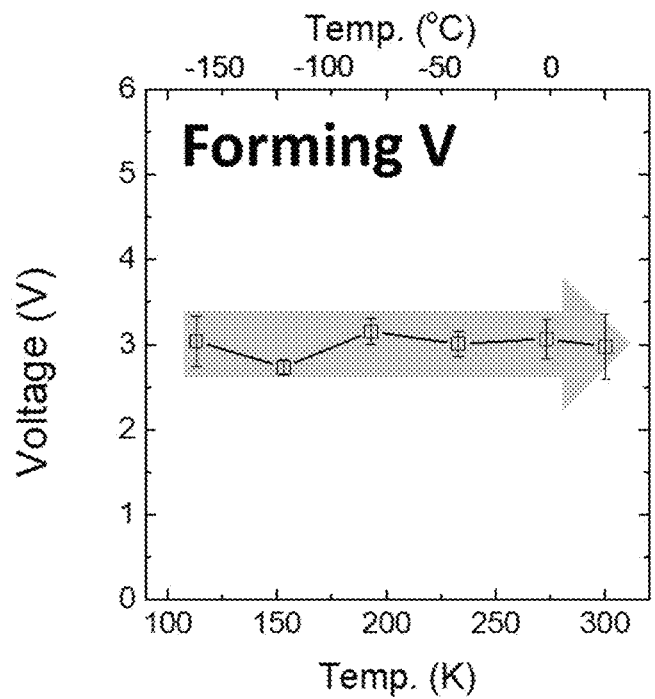
Figure 14C:
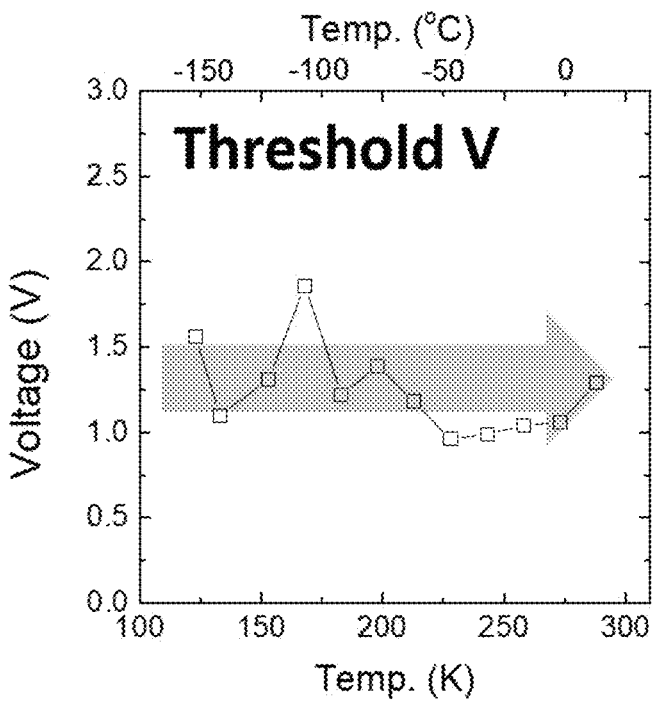
Figure 14D:
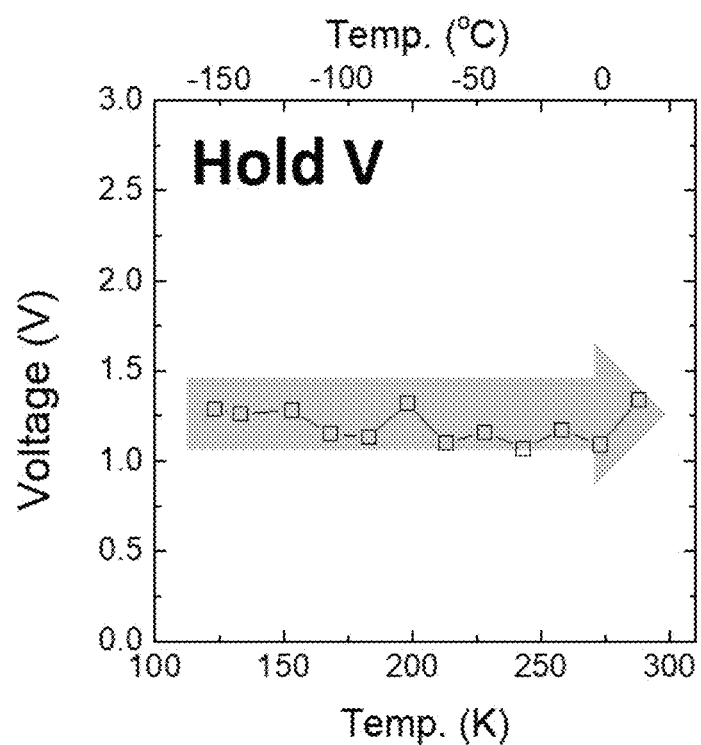

FIGS. 14B, 14C, and 14D show various characteristic changes of the selector device according to the temperature change. Each of the forming voltage, the threshold (i.e., turn-on) voltage, and the holding (i.e., turn-off) voltage may exhibit relatively independent characteristics with respect to the operating temperature. Without wishing to be bound by theory, the movement of ions may not be involved or a very small amount of movement of ions may be involved in the formation of a conduction path inside the switching layer (e.g., a thin film).

FIGS. 15A, 15B, 15C, and 15D show operating characteristics according to the application of an alternating current (AC) voltage to the selector device according to an embodiment of the present disclosure.

Figure 15A:
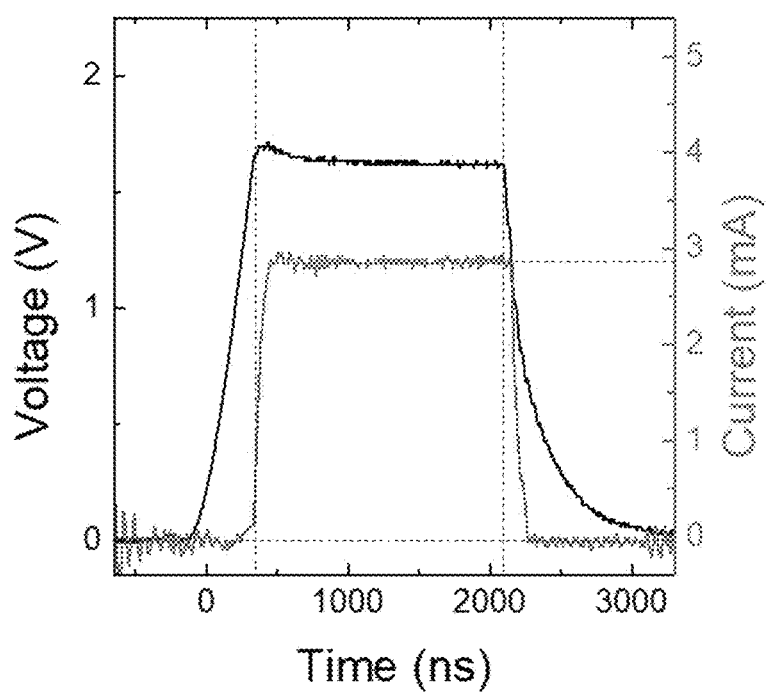
FIGS. 15A, 15B, 15C, and 15D show operating characteristics according to the application of an alternating current (AC) voltage to the selector device according to an embodiment of the present disclosure.
Figure 15B:
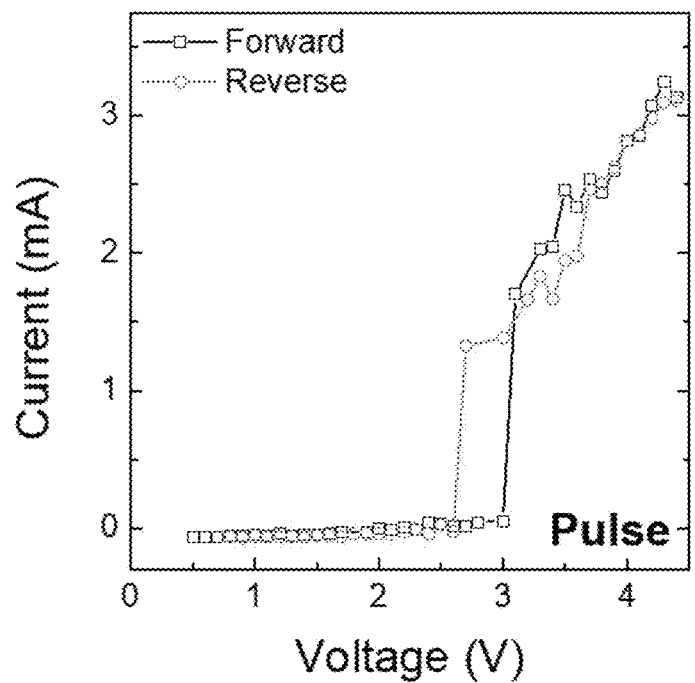

Referring to FIGS. 15A and 15B, when measuring AC characteristics, a single pulse may be applied to the selector device without applying a compliance current. Through this procedure, on-current may be checked.

Figure 15C:
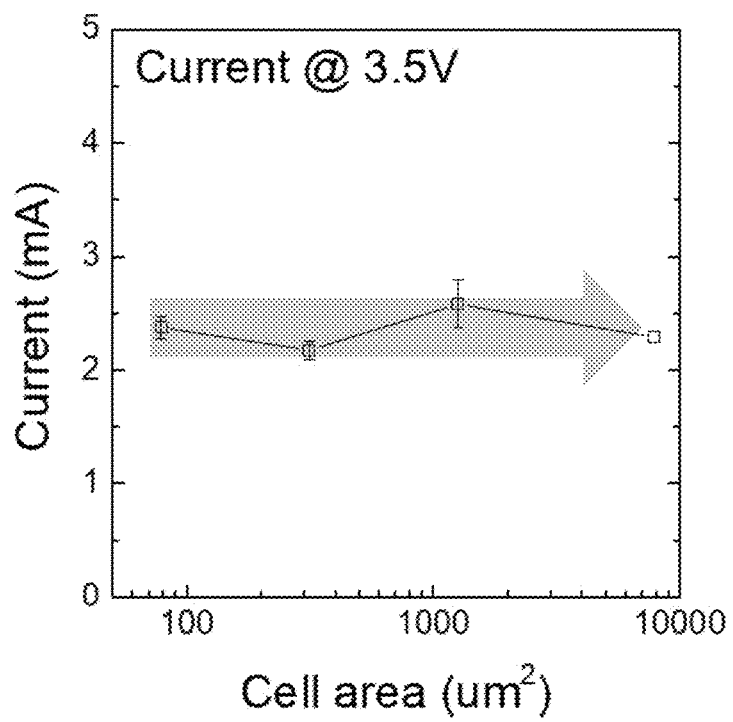

FIG. 15C shows a change in on-current according to the size of the selector device (AC pulse sweep). The size of the on-current was generally constant regardless of the size of the selector device. Accordingly, conduction through the switching layer of the selector device may be realized by a filament-based local conducting path.

Figure 15D:
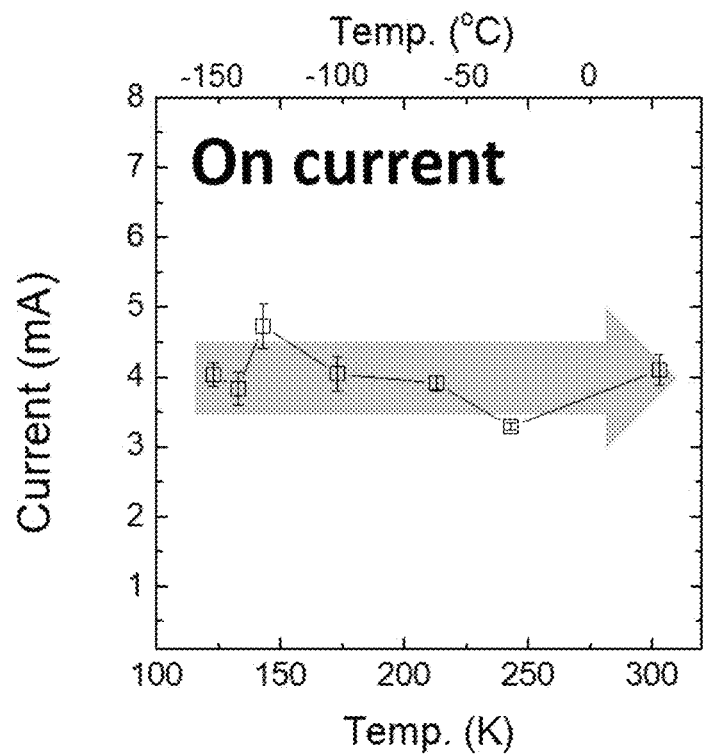

FIG. 15D shows an on-current change of a selector device according to a temperature change. On-current was relatively independent of an operating temperature. Without wishing to be bound by theory, it may be inferred that an electron tunneling-based conduction path is formed in the switching layer.

FIGS. 16A, 16B, 16C, and 16D each show a characteristic change when a voltage of a predetermined magnitude is continuously applied to a selector device according to an embodiment of the present disclosure.

Referring to FIGS. 16A to 16D, when a voltage is linearly swept and applied to the selector device according to a general voltage application method, an operating voltage may be around 1.45 V (which is indicated by a dotted line in the graph). The threshold switching operation may be analyzed by continuously applying a voltage of a predetermined magnitude smaller than the threshold voltage Vth and injecting charges into the switching layer.

Figure 16A:
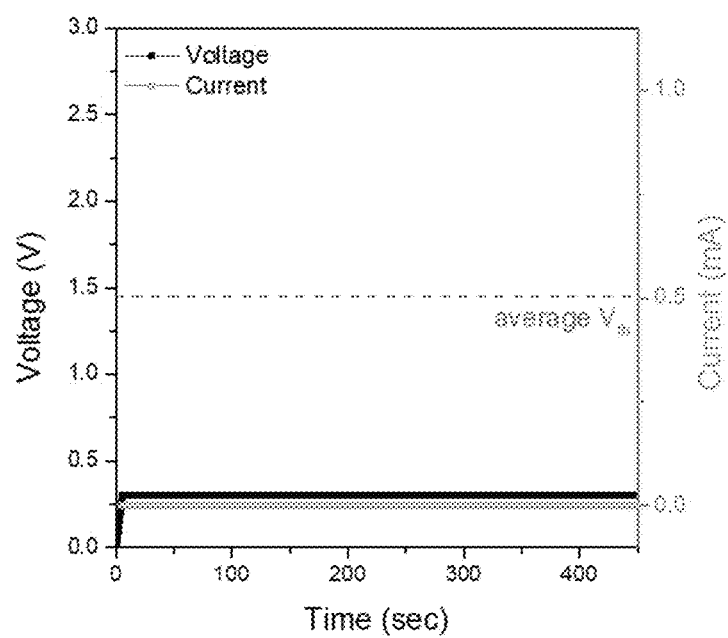
FIGS. 16A, 16B, 16C, and 16D each show a characteristic change when a voltage of a predetermined magnitude is continuously applied to a selector device according to an embodiment of the present disclosure.
Figure 16B:
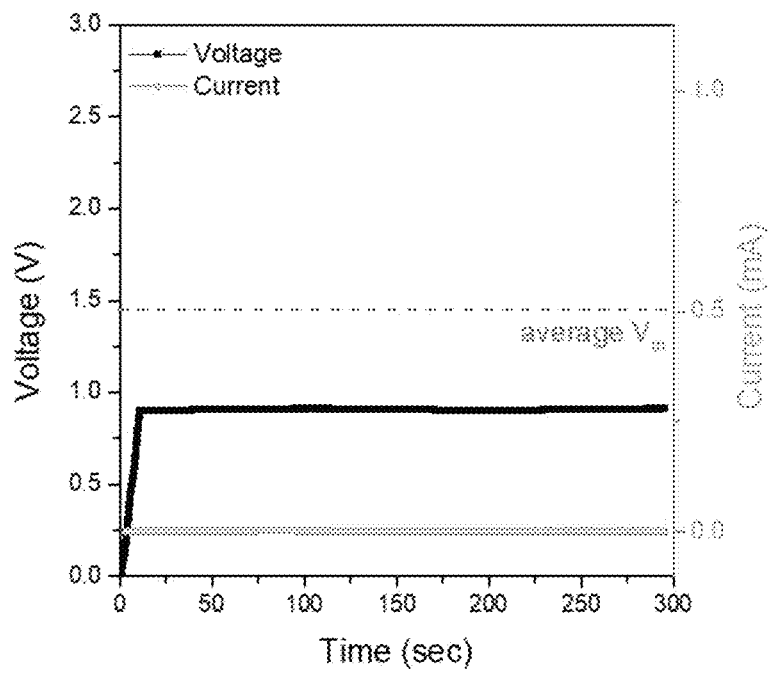
Figure 16C:
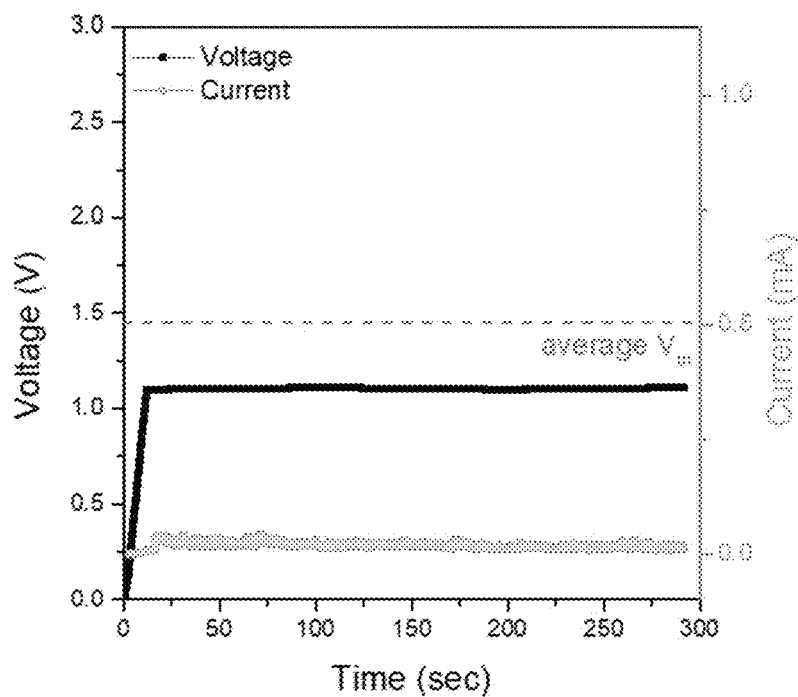
Figure 16D:
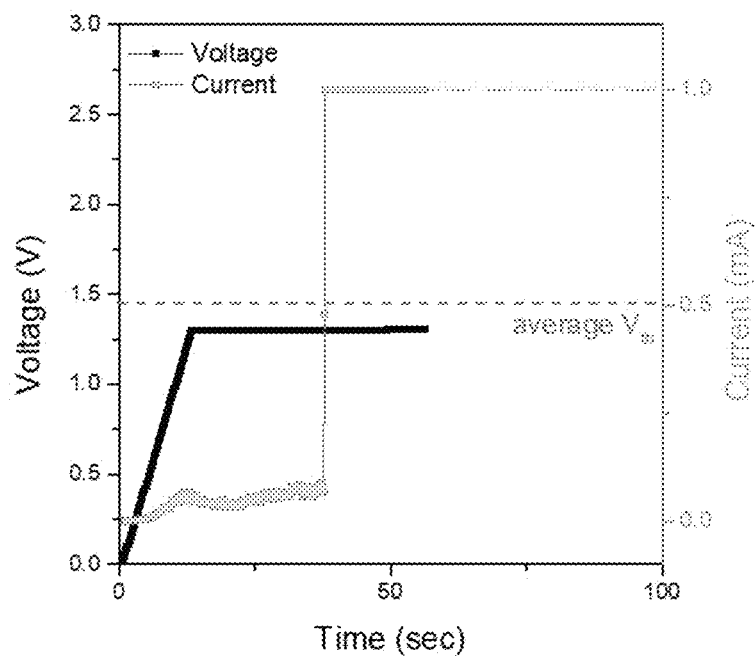

As shown in FIGS. 16A, 16B, and 16C, when a low voltage is applied, the selector device is not turned on even after charge is injected for a very long time. On the other hand, as shown in FIG. 16D, when a high voltage of a certain level (about 1.3V) or more is applied for a long time, a turn-on operation may be observed at a voltage lower than the operating voltage due to charge injection. From these results, the selector device may operate depending on charge charging (electron charging). In addition, the turn-on operation may depend on an applied voltage (e.g., a magnitude of the applied voltage) in addition to the charging.

Figure 17A:
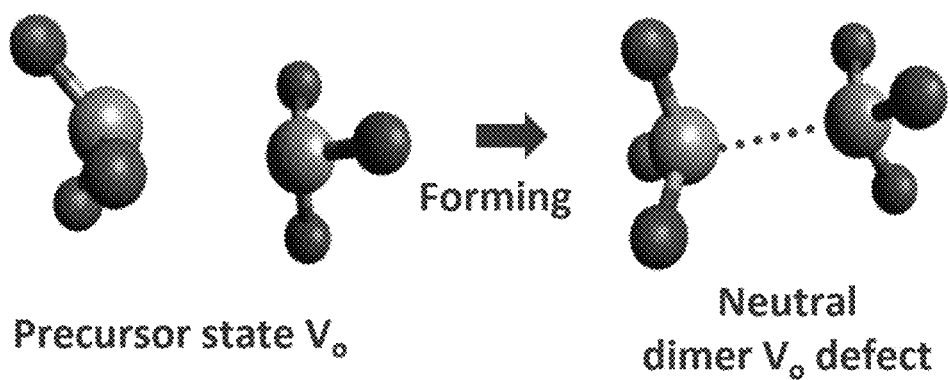
FIGS. 17A, 17B, and 17C illustrate a charged oxygen vacancy model related to an operation of a selector device according to an embodiment of the present disclosure.
Figure 17B:
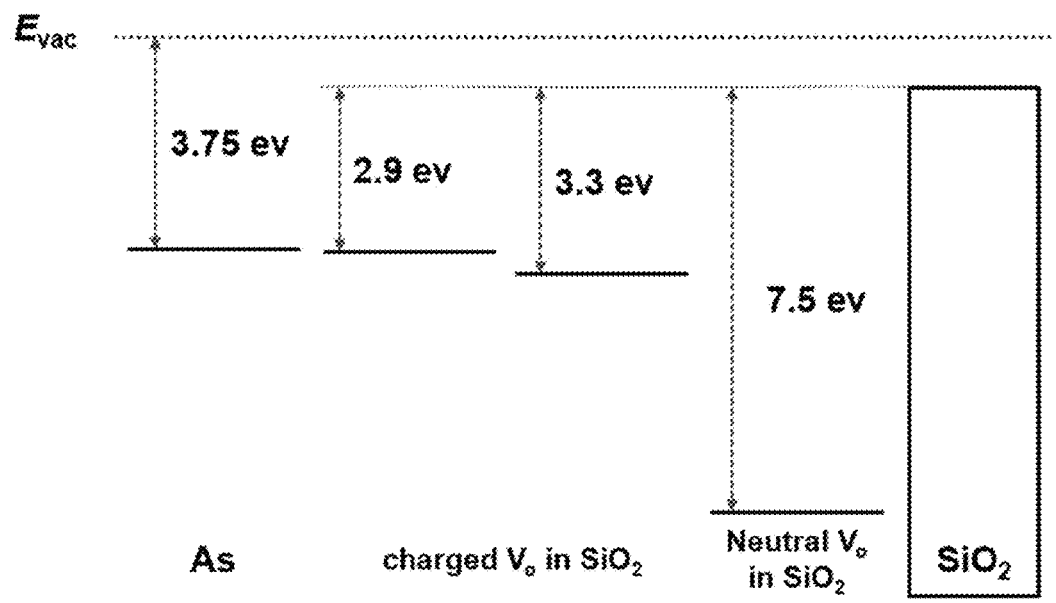
Figure 17C:
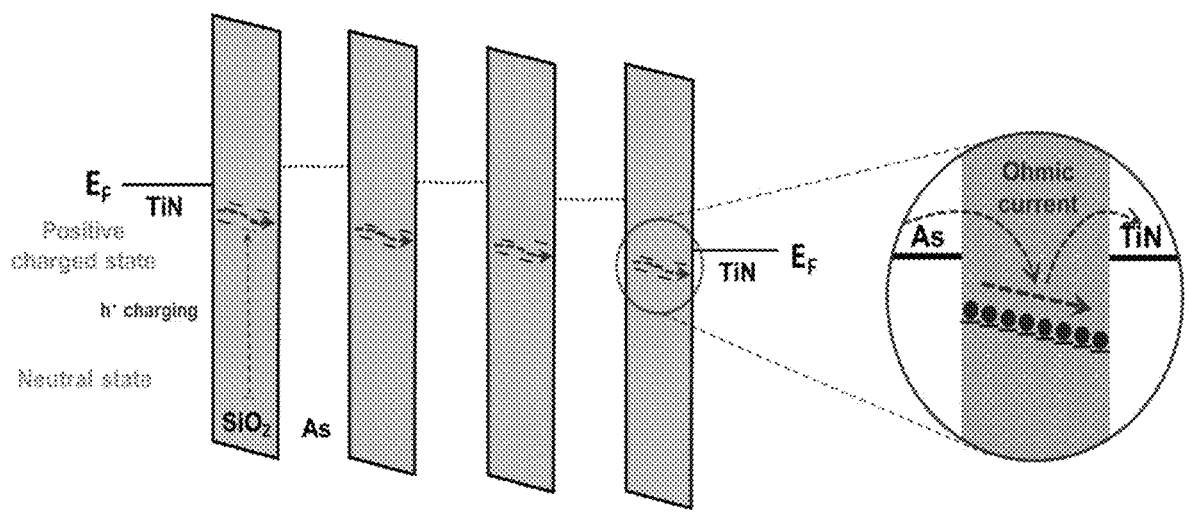

FIGS. 17A, 17B, and 17C illustrate a charged oxygen vacancy model related to an operation of a selector device according to an embodiment of the present disclosure.

FIG. 17A shows a process for forming a neutral dimer defect by a forming process, FIG. 17B shows a change in defect energy level according to electric charging and voltage application, and FIG. 17C schematically shows the threshold switching characteristics due to the change in the energy band of the switching layer. FIGS. 17A to 17C may relate to an operation of a selector device having the structure of FIG. 1A.

Among the large amount of oxygen vacancy ($V_o$) in the $SiO_2$ thin film formed during the ion injection process of As, when two adjacent oxygen vacancies ($V_o$) have a dimer-type local structure, a more stable energy level may be obtained. In the case of the forming process, a stable neutral dimer defect may be formed through structure relaxation in two $SiO_2$ defects adjacent to each other by an electric field in the thin film (a switching layer). Structural relaxation of $SiO_2$ defects may entail little physical movement (temperature independence of $V_{forming}$). As energy is injected for $V_o$ to form a dimer state, once a dimer state is created, it may not be destroyed (irreversible property).

A charged defect formed through hole charging to a neutral dimer defect may have a higher energy level, and the energy level of the charged defect at this time may be similar to the work function of As present in $SiO_2$ (a hole charging effect).

Without wishing to be limited by theory, a local conducting path based on hole tunneling across the thin film (a switching layer) may be formed through the alignment between As and the charged dimer defect (area non-dependence of on-current and temperature non-dependence of operating characteristics). That is, in the forming process, the formation of a neutral dimer defect of $SiO_2$ internal oxygen vacancy and the formation of a defect in a variable positive state of charge through hole charging into the neutral dimer state may occur in a complex manner and thereby, a hole-based tunneling current may flow in the insulating layer, and an ohmic current substantially approximating an ohmic characteristic may flow between an actual electrode, an insulator, and a metal element (As).

In addition, as the applied voltage decreases, it is expected that turn-off will occur by de-trapping the charges inside the charged defect state. In the case of the sweep process, a tunneling path is connected due to the generation of a charged defect by charging to a neutral dimer defect generated in the forming process because of an electric field; and a band alignment between As/charged defect states, and as a result, it is expected to be turned on.

Figure 18A:
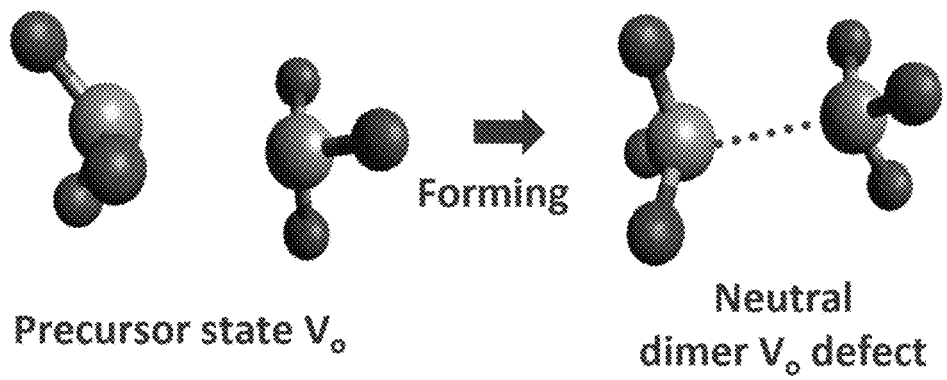
FIGS. 18A, 18B, and 18C illustrate a charged oxygen vacancy model related to an operation of a selector device according to another embodiment of the present disclosure.
Figure 18B:
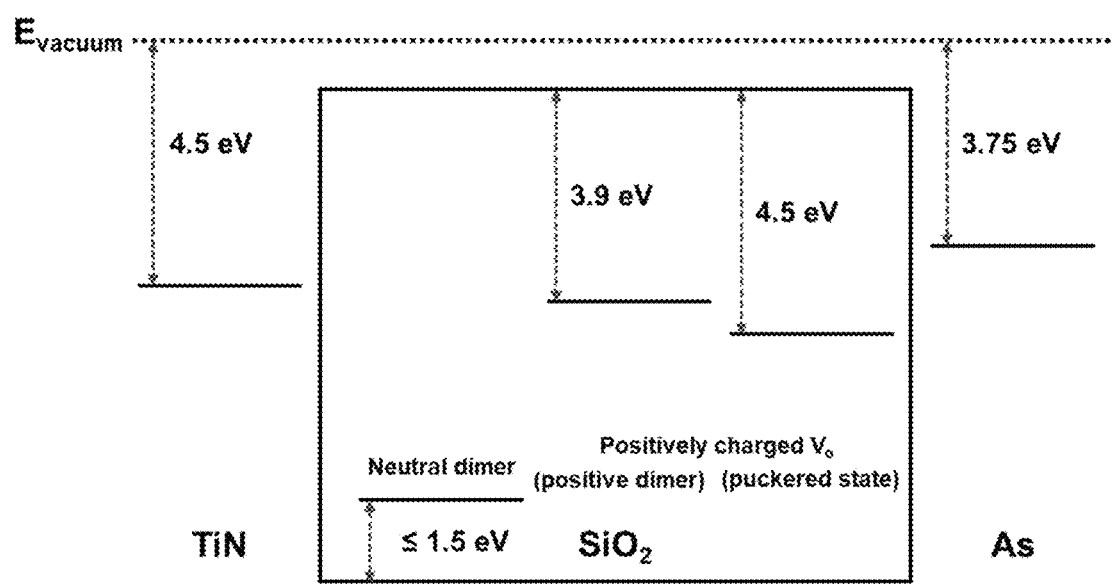
Figure 18C:
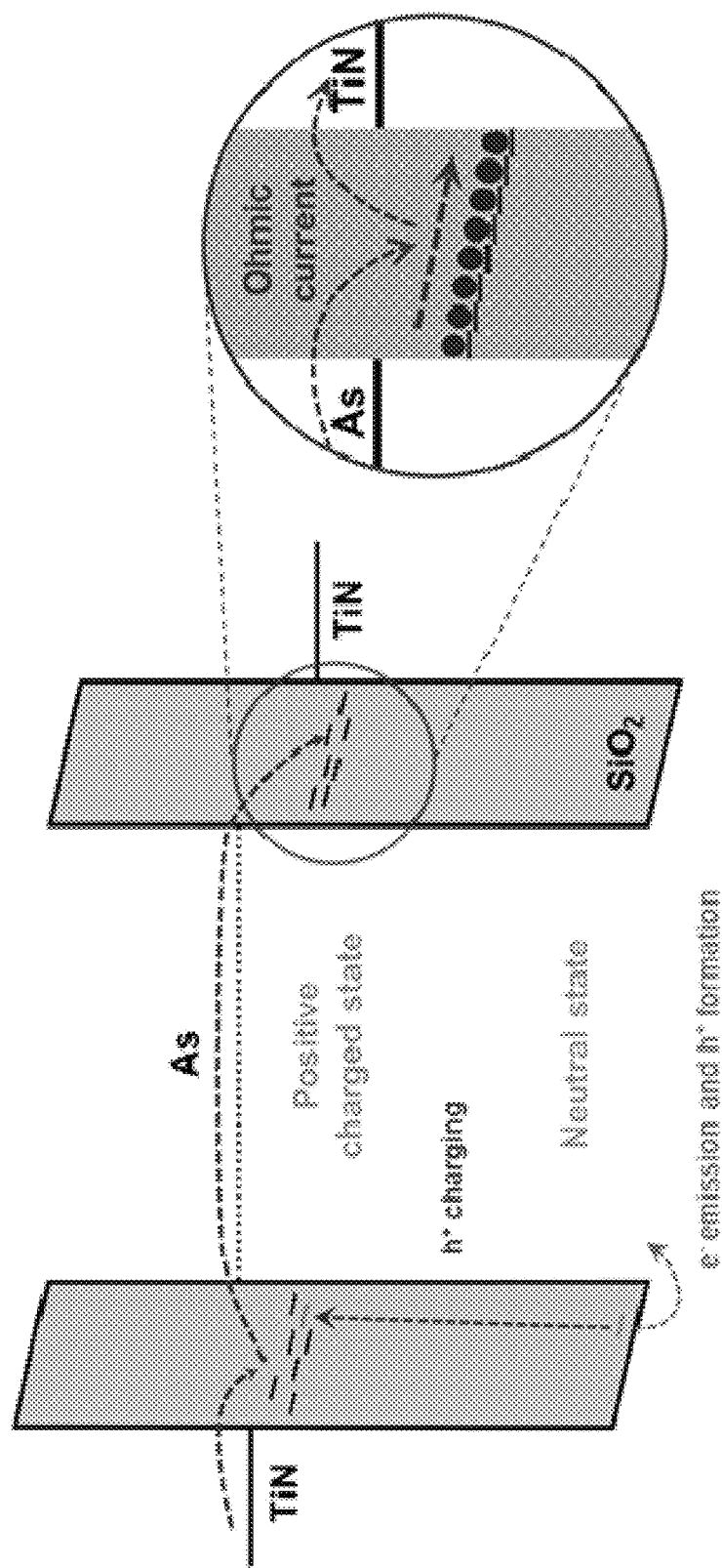

FIGS. 18A, 18B, and 18C illustrate a charged oxygen vacancy model related to an operation of a selector device according to another embodiment of the present disclosure. FIGS. 18A to 18C may relate to an operation of a selector device having the structure of FIG. 1B. FIG. 18A shows the process for forming a neutral dimer defect by a forming process, FIG. 18B shows the change in the defect energy level according to electric charging and voltage application, and FIG. 18C schematically shows the threshold switching characteristics due to the change in the energy band of the switching layer.

Figure 19A:
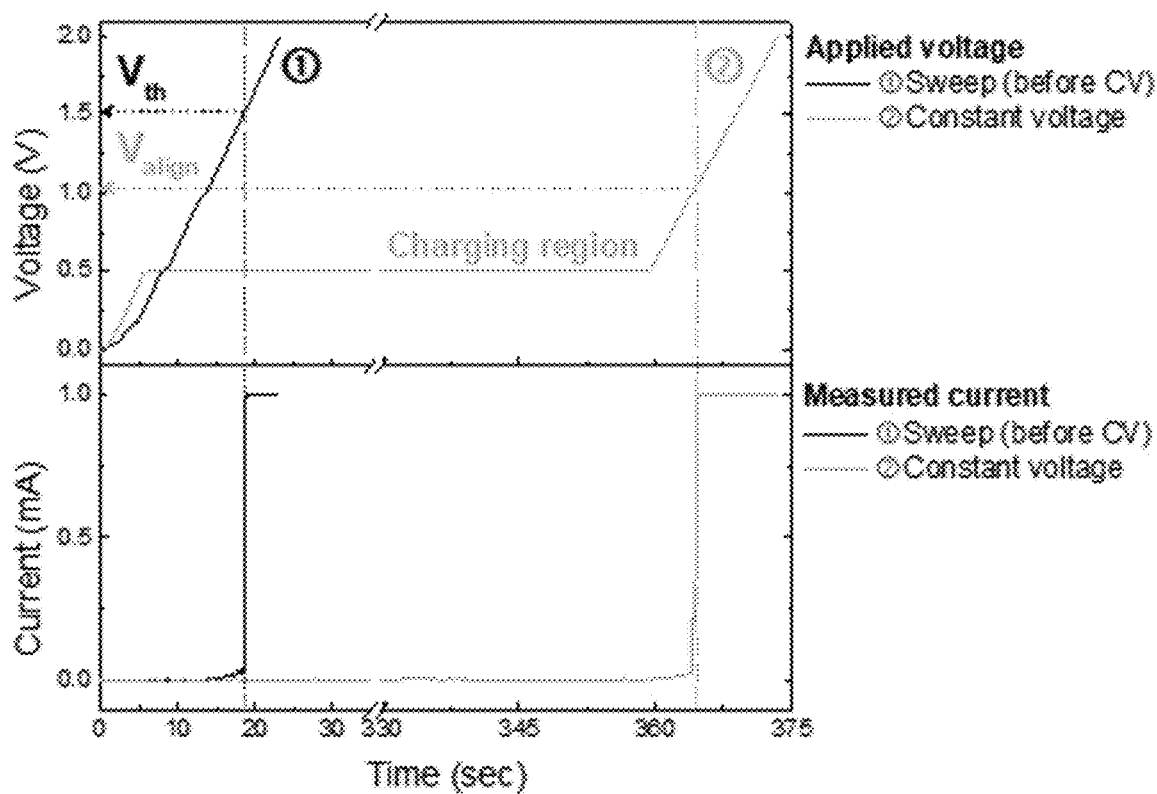
FIGS. 19A, 19B, and 19C illustrate a characteristic change according to the application of a constant DC voltage to a selector device according to an embodiment of the present disclosure.
Figure 19B:
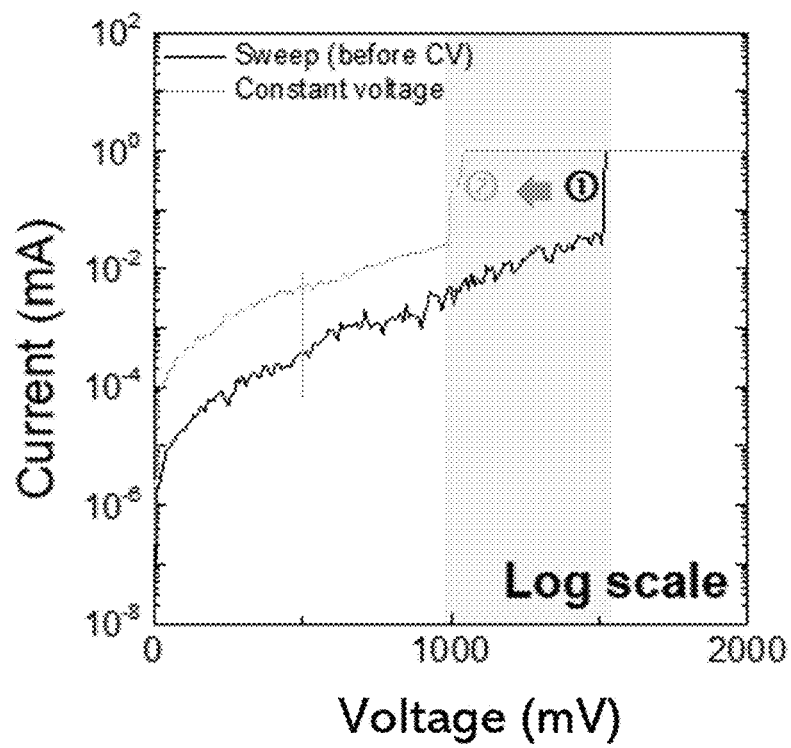
Figure 19C:
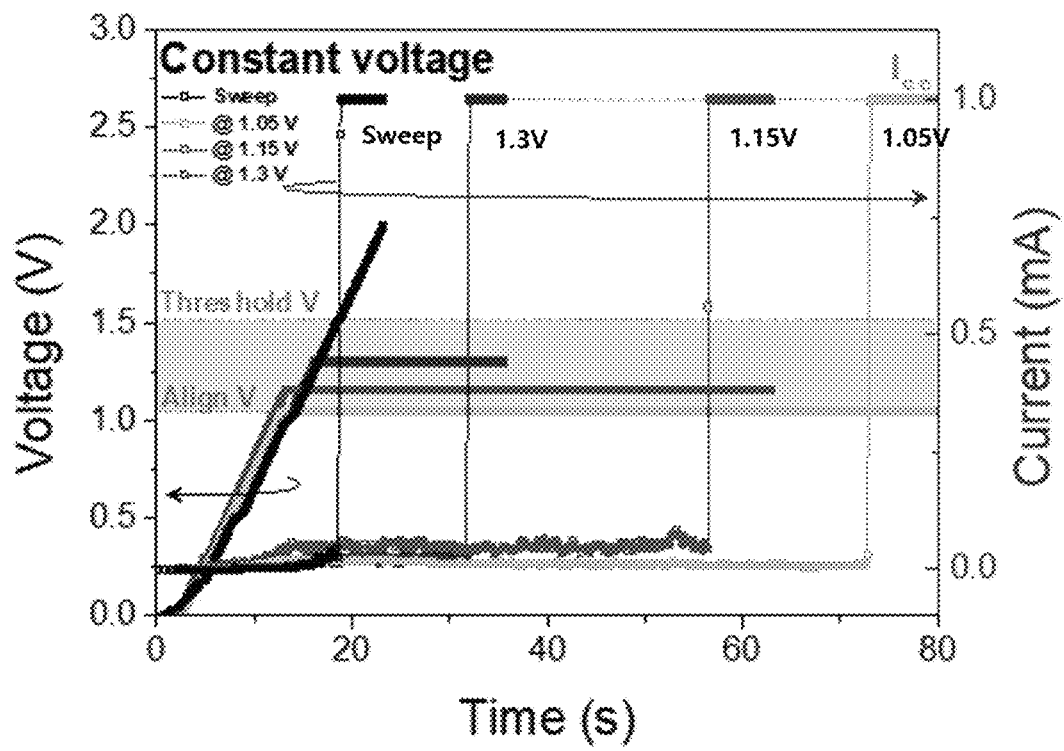

FIGS. 19A, 19B, and 19C illustrate a characteristic change according to the application of a constant DC voltage to a selector device according to an embodiment of the present disclosure.

Referring to FIGS. 19A and 19B, after sufficient charging to the dimer has been performed at a low voltage at which threshold switching does not occur, the selector device is turned on at a specific voltage (e.g., about 1.04 V), when a voltage is linearly increased.

If a sufficient charging step is performed, the energy level of the defect may be increased through charging to the dimer defect. Since the energy level of the dimer defect is already similar to As (metal) in the linear voltage rising step, a conduction path through which an ohmic current flows due to the electric field may be completed. When charging to the neutral dimer defect is completed, it may be experimentally confirmed that the voltage at which the band aligns between As and the charged defect is lower than the actually observed operating voltage. It was confirmed that adjusting the operating voltage (a threshold voltage) through this DC voltage application experiment is possible.

FIG. 19C shows the change in operating characteristics according to the application of a constant voltage at a value capable of band alignment between As and the charged defect. If sufficient charging to the dimer in the switching layer (a thin film) was not performed, it was not turned on even at a high voltage where band alignment between As/charged defects was possible. The turn-on operation is performed at all voltages above $V_{align}$, and as the magnitude of the applied voltage increases, the application time of a constant voltage required for turn-on decreases. It was experimentally confirmed that turn-on was performed only when the following conditions are satisfied: (1) sufficient electric charge injection for dimer charging; and (2) a voltage above a specific value for band alignment between as/charged defects.

Figure 20A:
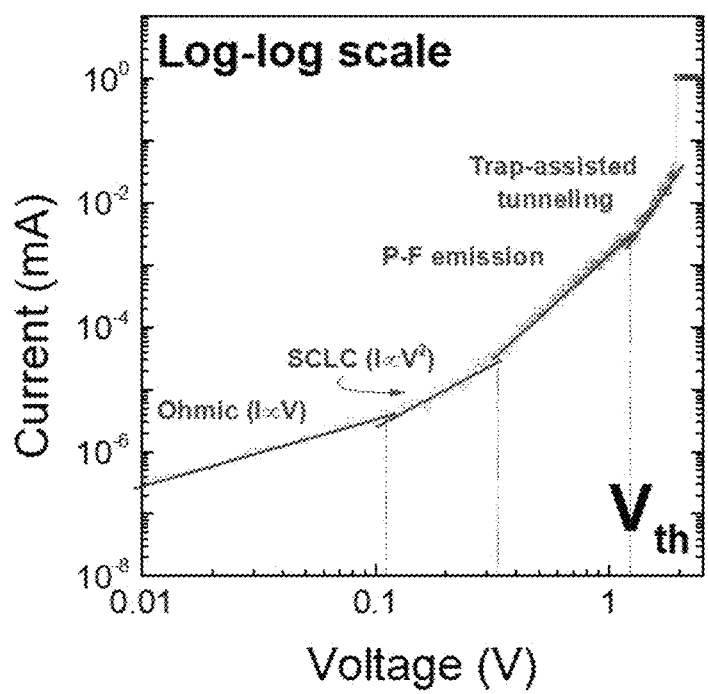
FIGS. 20A, 20B, and 20C illustrate an off-current conduction mechanism (charging evolution) of a selector device according to an embodiment of the present disclosure.
Figure 20B:
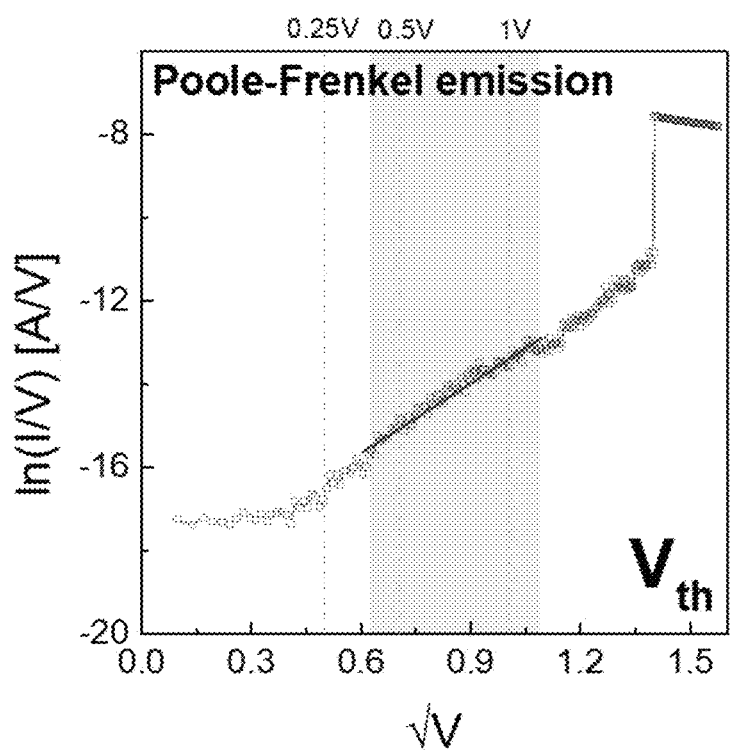
Figure 20C:
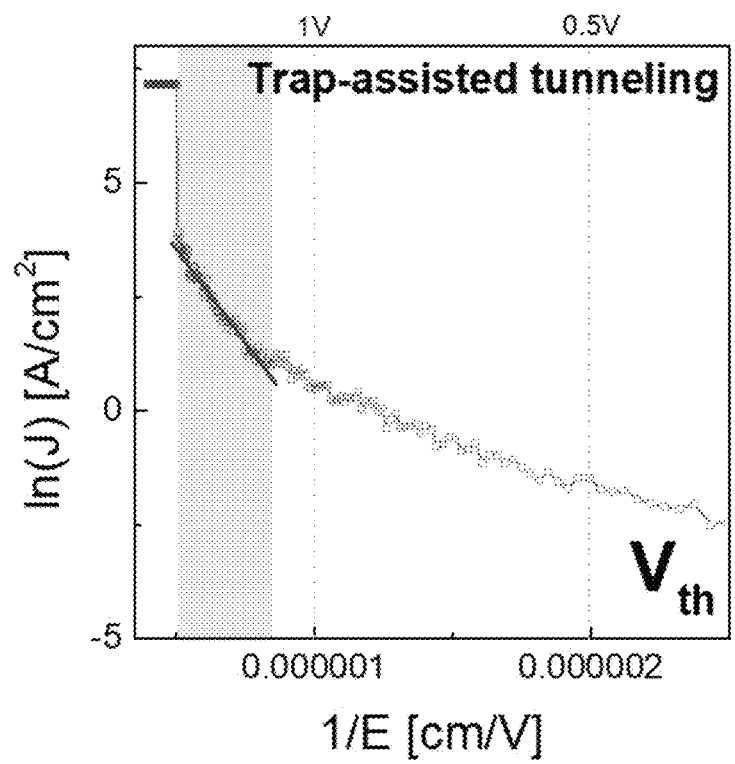

FIGS. 20A, 20B, and 20C illustrate an off-current conduction mechanism (charging evolution) of a selector device according to an embodiment of the present disclosure. The conduction mechanism of the off-current section of the forming and sweep curves was analyzed through slope analysis of log-log plots.

From the results of FIGS. 20A to 20C when the off-current of the sweep curve was analyzed, it was confirmed that the conduction mechanism was changed in the order of the ohmic conduction, Space Charge Limited Conduction (SCLC), Poole-Frenkel (P-F) emission, and trap-assisted tunneling (TAT).

In a very low voltage range, the amount of charge injected into the switching layer (thin film) is very small and thus, ohmic conduction of high resistance may occur. In the subsequent section, SCLC with a slope of 2 dominantly occurred. Charging by injecting electric charges into a neutral dimer defect in the switching layer (a thin film) was dominantly observed (charging-based conduction was confirmed). After SCLC, the slope increased to a value greater than 2. It was confirmed that the conduction was made due to P—F emission and trap-assisted tunneling as result of analysis through a fitting process. It was confirmed that tunneling-based conduction was made in the section just before turn-on. In the TAT section, band alignment between As/charged defects was made, and tunneling-based threshold switching occurred. In this section, as the concentration of the charged defect state increased, the As/charged defect state may be possible due to the band alignment.

Meanwhile, it may be confirmed that the selector device actually operates as a hole charging and tunneling-based conduction mechanism by analyzing the off-current of the forming.

Figure 21:
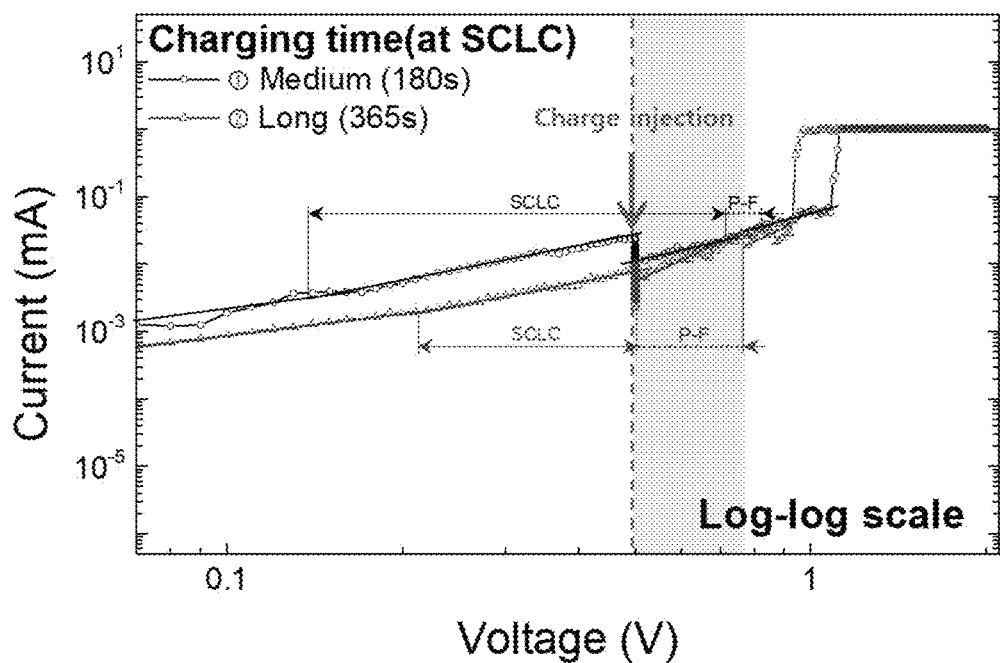
FIG. 21 is a graph showing a result evaluating the time dependence (i.e., charging time dependency) of charging for a selector device according to an embodiment of the present disclosure.
Figure 22A:
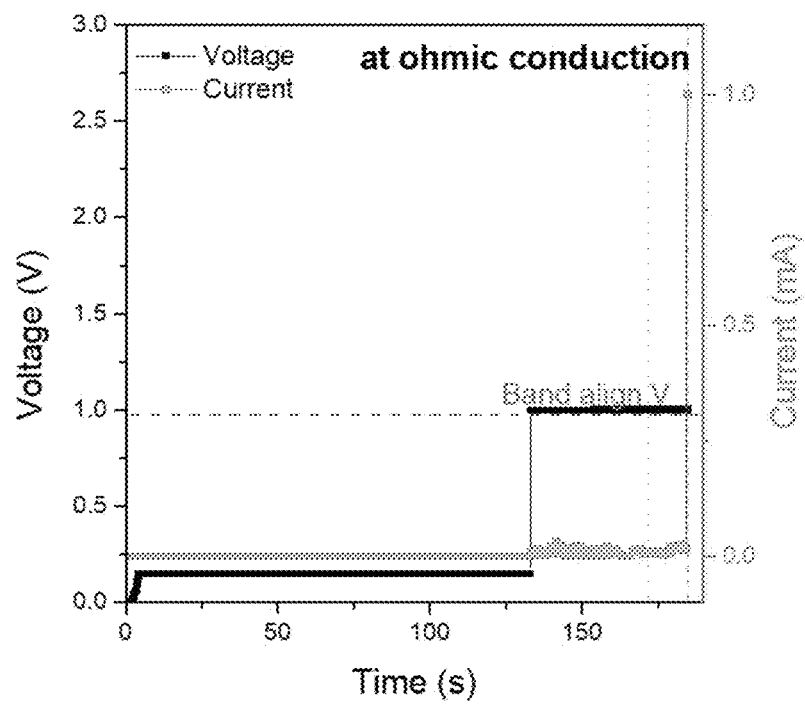
FIGS. 22A, 22B, 22C, 22D, and 22E illustrate a mechanism verification by applying a 2-step constant voltage (DC) to a selector device according to an embodiment of the present disclosure.
Figure 22B:
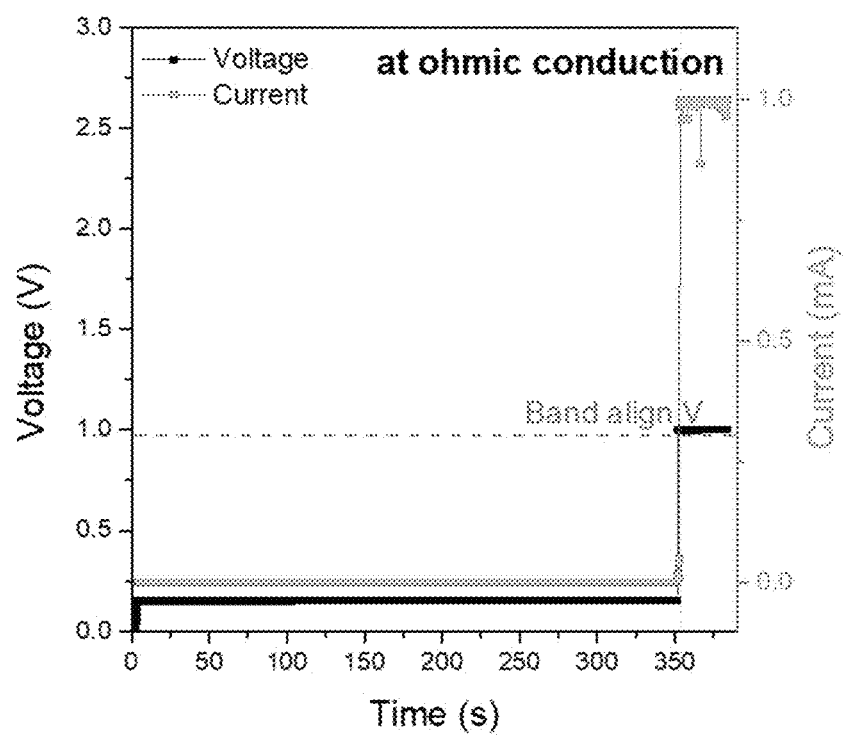
Figure 22C:
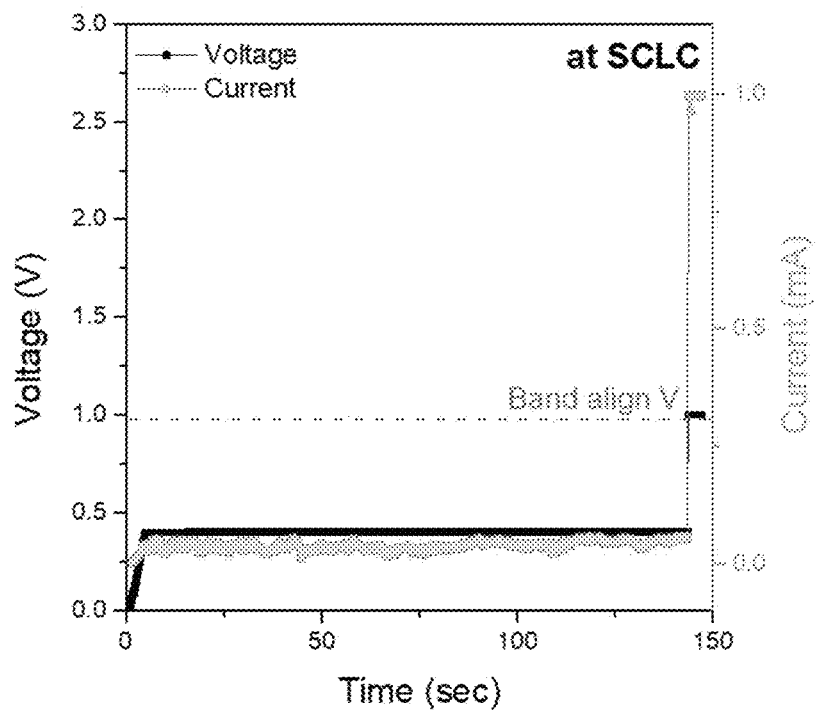
Figure 22D:
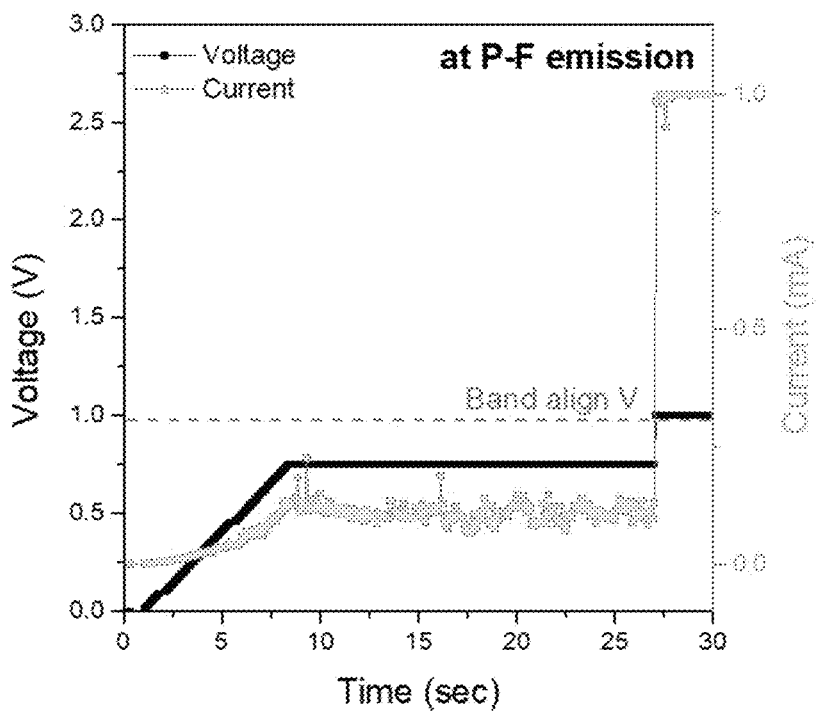
Figure 22E:
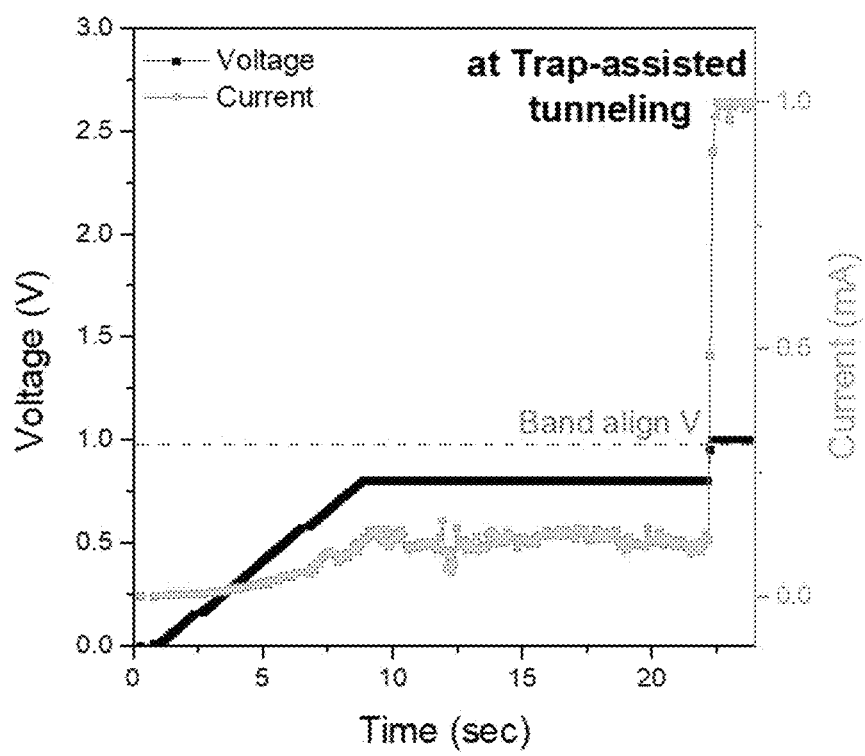

FIG. 21 is a graph showing a result evaluating the time dependence (i.e., charging time dependency) of charging for a selector device according to an embodiment of the present disclosure.

Referring to FIG. 21, a change of a conduction mechanism according to an application time (charge injection time) of a constant voltage was analyzed. Without wishing to be bound by theory, the conduction mechanism change immediately after applying a constant voltage (e.g., 0.5 V) corresponding to the SCLC section in the same cell for each constant voltage time may be analyzed as follows: (1) In the case of medium charging time (e.g., 180 s), the slope was maintained at ~2 even after a constant voltage was applied, which may be obtained when charging to the dimer is not completed over a certain level. In this case, SCLC conduction by dimer charging was predominantly observed even after the charging section; and (2) In the case of a long charging time (e.g., 365 s), the slope increased immediately after a constant voltage was applied (slope>2), which may be obtained when charging to the dimer was completed over a certain level. In this case, as charging is completed to some extent, it is estimated that the entire mechanism changes to P—F emission immediately after the SCLC section.

The amount of charge injected into the thin film varies according to the charging time, and charging to the dimer may be completed over a certain level in the SCLC section. In addition, it may be confirmed that the conduction mechanism in the off section may be changed according to the charging time when the electric charges are injected regardless of the applied voltage.

FIGS. 22A, 22B, 22C, 22D, and 22E illustrate a mechanism verification by applying a 2-step constant voltage (DC) to a selector device according to an embodiment of the present disclosure.

Referring to FIGS. 22A to 22E, a charging step for each low voltage ($<V_{align}$) corresponding to the off-current conduction section and a threshold switching operation related to a voltage increase up to $V_{align}$ were analyzed. In the Ohmic section, depending on whether charging was completed, the turn-on status was shown differently when $V_{align}$ was applied.

If the dimer charging was not completed, it was not turned on immediately due to insufficient charging of the dimer, but was turned on after additional charging was completed at a high voltage ($V_{align}$). When charging is complete to the dimer, it is turned on immediately after reaching $V_{align}$. Accordingly, it was confirmed that sufficient charging to the dimer is required for turn-on.

In all conduction sections including the Ohmic section, dimer charging was completed by charge injection, and a threshold switching operation occurred immediately after the voltage rise. The turn-on occurred by applying the $V_{align}$ voltage even in a section where turn-on did not occur only by charging at a low voltage. Accordingly, a voltage capable of band alignment between As/charged defects as well as sufficient charging to the dimer may be required for turn-on.

Meanwhile, in the case of FIGS. 5 to 7 described above, it may correspond to a mechanism verification result using a 2-step single pulse (AC) including a threshold voltage control pulse. Referring to the results of FIGS. 5 to 7, like the DC results, in the AC analysis, it may be confirmed that the turn-on operation may be performed by the band alignment between charging to the dimer and the As/charged defect through pre-charging to the dimer in the stage before the turn-on operation.

According to the embodiments of the present disclosure described above, it is possible to implement an operating method of a selector device capable of easily adjusting the characteristics (e.g., threshold voltage) of the selector device without changing (adjusting) the material or the configuration of the selector device. Accordingly, the characteristic (threshold voltage) of the selector device may be adjusted according to the type and material of the memory element coupled to the selector device. Since the characteristic (threshold voltage) of the selector device may be adjusted according to the memory characteristics without change of a manufacturing process and structural change of the selector device, the techniques according to the embodiment may be usefully applied to research and development of next-generation memory devices. In particular, the techniques according to the embodiment may be usefully applied to a crossbar memory array device.

In the present specification, the preferred embodiments of the present disclosure have been disclosed, and although the specific terms are used, these are only used in a general sense to easily describe the technical content of the present disclosure and to help the understanding of the present disclosure, and they are not used to limit the scope of the present disclosure. Other modifications based on the technical spirit of the present disclosure may be implemented in addition to the embodiments disclosed herein. It will be understood by those of ordinary skill in the art to which the present disclosure pertains that in connection with the operating method of a selector device, the operating method of a non-volatile memory apparatus to which the method is applied, the electronic circuit device and the non-volatile memory apparatus including the selector device according to the embodiment described with reference to FIGS. 1A to 22E, various substitutions, changes, and modifications may be possible. Therefore, the scope of the disclosure should not be determined by the described embodiments, but should be determined by the technical concepts described in the claims.

EXPLANATION OF SYMBOLS

*Explanation of Symbols for the Main Parts of the Drawing*

E1: first electrode
E2: second electrode
EL10: first electrode line
EL20: second electrode line
D10: driving circuit unit
M: metal ion
MC1: memory cell
MD1: memory element
N: insulator
S1: switching layer
SD1: selector device
SD10: selector device
VP1: pre-charging voltage pulse
VP2: operating voltage pulse
100: memory device unit
200: memory control circuit unit.

What is claimed is:

1. A method of operating a selector device for controlling access to a memory element, the method comprising:
providing the selector device that includes a switching layer and first and second electrodes disposed on both surfaces of the switching layer, the switching layer including an insulator and a metal element; and
applying a multi-step voltage pulse to the switching layer via the first and second electrodes to adjust a threshold voltage of the selector device, the multi-step voltage pulse including a threshold voltage control pulse and an operating voltage pulse that is subsequent to the threshold voltage control pulse,
wherein the operating voltage pulse has a magnitude for turning on the selector device, and the threshold voltage control pulse has a magnitude lower than that of the operating voltage pulse.

2. The method of claim 1, wherein the insulator includes defects, and the selector device is a two-terminal device which operates based on charge charging into the defects of the insulator and forming a conduction path between the insulator and the metal element.

3. The method of claim 1, wherein the insulator includes one or more of silicon oxide, aluminum oxide, zirconium oxide, hafnium oxide, tungsten oxide, titanium oxide, nickel oxide, copper oxide, manganese oxide, tantalum oxide, niobium oxide, iron oxide, antimony oxide, silicon nitride, and aluminum nitride.

4. The method of claim 1, wherein the metal element includes one or more of arsenic (As), germanium (Ge), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

5. The method of claim 1, wherein the switching layer includes the insulator doped with the metal element.

6. The method of claim 5, wherein the insulator includes silicon oxide ($SiO_2$), and the metal element includes arsenic (As).

7. The method of claim 1, wherein a duration of the threshold voltage control pulse is about 0.1 µs to about 500 µs.

8. The method of claim 1, wherein the magnitude of the threshold voltage control pulse is about 0.3 V to about 2.0 V.

9. The method of claim 1, wherein the threshold voltage is decreased by the application of the threshold voltage control pulse, and a decrease width of the threshold voltage is less than 1.5 V.

10. The method of claim 1, wherein a duration of the operating voltage pulse is about 0.01 µs to about 10 µs, and the magnitude of the operating voltage pulse is about 0.5 V to about 5 V.

11. The method of claim 1, wherein the multi-step voltage pulse has a single aggregated waveform including the threshold voltage control pulse and the operating voltage pulse.

12. A method of operating a non-volatile memory apparatus comprises the method of operating the selector device according to claim 1,
wherein the memory apparatus comprises a plurality of first electrode lines extending in a first direction, a plurality of second electrode lines spaced apart from the plurality of first electrode lines and extending in a second direction that intersects the first direction, and a plurality of memory cells disposed at intersections between the plurality of first electrode lines and the plurality of second electrode lines, the memory element and the selector device being included in a corresponding one of the plurality of memory cells and coupled to each other in series.

13. An electronic circuit device comprising:
a selector device configured to control access to a memory element, the selector device including a switching layer and first and second electrodes disposed on both surfaces of the switching layer, the switching layer including an insulator and a metal element; and
a driving circuit configured to apply a multi-step voltage pulse to the switching layer via the first and second electrodes and to adjust a threshold voltage of the selector device, the multi-step voltage pulse including a threshold voltage control pulse and an operating voltage pulse that is subsequent to the threshold voltage control pulse,
wherein the operating voltage pulse has a magnitude for turning on the selector device, the threshold voltage control pulse has a magnitude lower than that of the operating voltage pulse.

14. The electronic circuit device of claim 13, wherein the insulator includes defects, and the selector device is a two-terminal device which operates based on charge charging into the defects of the insulator and forming a conduction path between the insulator and the metal element.

15. The electronic circuit device of claim 13, wherein the insulator includes one or more of silicon oxide, aluminum oxide, zirconium oxide, hafnium oxide, tungsten oxide, titanium oxide, nickel oxide, copper oxide, manganese oxide, tantalum oxide, niobium oxide, iron oxide, antimony oxide, silicon nitride, and aluminum nitride.

16. The electronic circuit device of claim 13, wherein the metal element includes one or more of arsenic (As), germanium (Ge), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

17. The electronic circuit device of claim 13, wherein the switching layer includes the insulator doped with the metal element.

18. The electronic circuit device of claim 17, wherein the insulator includes a silicon oxide ($SiO_2$), and the metal element includes arsenic (As).

19. The electronic circuit device of claim 13, wherein a duration of the threshold voltage control pulse is about 0.1 µs to about 500 µs.

20. The electronic circuit device of claim 13, wherein the magnitude of the threshold voltage control pulse is about 0.3 V to about 2.0 V.

21. The electronic circuit device of claim 13, wherein the driving circuit is configured to decrease the threshold voltage by the application of the threshold voltage control pulse, and a decrease width of the threshold voltage is less than 1.5 V.

22. The electronic circuit device of claim 13, wherein a duration of the operating voltage pulse is about 0.01 µs to about 10 µs.

23. The electronic circuit device of claim 13, wherein the magnitude of the operating voltage pulse is about 0.5 V to about 5 V.

24. A non-volatile memory apparatus comprising:
a memory device comprising a plurality of first electrode lines extending in a first direction, a plurality of second electrode lines spaced apart from the plurality of first electrode lines and extending in a second direction that intersect the first direction, and a plurality of memory cells disposed at intersections between the plurality of first electrode lines and the plurality of second electrode lines, each of the plurality of memory cells comprising a memory element and a selector device coupled with the memory element in series; and
a memory control circuit controlling an operation of the memory device, and including a driving circuit driving the selector device,
wherein the selector device and the driving circuit constitute the electronic circuit device of claim 13.

* * * * *